United States Patent
Akahori et al.

(10) Patent No.: US 6,218,299 B1
(45) Date of Patent: *Apr. 17, 2001

(54) SEMICONDUCTOR DEVICE AND METHOD FOR PRODUCING THE SAME

(75) Inventors: Takashi Akahori, Hachioji; Yoko Naito; Shunichi Endo, both of Sagamihara; Masahide Saito, Setagaya-Ku; Takeshi Aoki, Hachioji; Tadashi Hirata, Sagamihara, all of (JP)

(73) Assignee: Tokyo Electron Limited, Tokyo-To (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,244
(22) PCT Filed: Nov. 13, 1997
(86) PCT No.: PCT/JP97/04144
  § 371 Date: Jul. 6, 1998
  § 102(e) Date: Jul. 6, 1998
(87) PCT Pub. No.: WO98/21748
  PCT Pub. Date: May 22, 1998

(30) Foreign Application Priority Data

Nov. 14, 1996 (JP) .................................... 8-320913

(51) Int. Cl.[7] ...................................... H01L 21/44
(52) U.S. Cl. .......................... 438/682; 438/780; 438/788
(58) Field of Search .................... 438/780, 788, 438/682

(56) References Cited

U.S. PATENT DOCUMENTS

| 3,950,833 | * | 4/1976 | Adams ................................. 29/132 |
| 4,793,041 | * | 12/1988 | Jenkins et al. ....................... 29/121.1 |
| 5,302,420 | * | 4/1994 | Nguyen et al. ....................... 427/490 |
| 5,326,431 | * | 7/1994 | Kadomura ............................ 156/659 |
| 5,441,914 | * | 8/1995 | Taft et al. ............................ 437/189 |
| 5,449,659 | * | 9/1995 | Garrison et al. ..................... 505/330 |
| 5,578,099 | * | 11/1996 | Neff ..................................... 51/297 |
| 5,723,383 | * | 3/1998 | Kosugi et al. ....................... 438/719 |
| 5,783,049 | * | 7/1998 | Bright et al. ................... 204/192.14 |
| 5,858,077 | * | 1/1999 | Kayanoki ........................ 106/287.11 |
| 5,897,377 | * | 4/1999 | Suzuki ................................. 438/706 |

FOREIGN PATENT DOCUMENTS 61-218134   9/1986   (JP) .
62-43335   12/1987   (JP) .

(List continued on next page.)

OTHER PUBLICATIONS

Endo et al., *Flourinated amorphous carbon thin films grown by plasma enhanced chemical vapor deposition for low dielectric constant interlayer dielectrics*, Journal of Applied Physics, vol. 78, No. 2, p. 1370–1372 (Jul. 15, 1995).

(List continued on next page.)

*Primary Examiner*—Matthew Smith
*Assistant Examiner*—Renzo Rocchegiani
(74) *Attorney, Agent, or Firm*—Smith, Gambrell & Russell, LLP

(57) ABSTRACT

For example, in a plasma processing system, $C_4F_8$ gas and $C_2H_4$ gas are introduced as film-forming gases at flow rates of 60 sccm and 30 sccm, respectively, under the conditions of a pressure of 0.2 Pa, a microwave power of 2.7 kW, a radiofrequency power of 1.5 kW, and a wafer temperature of 350° C. At the same time, a plasma gas is also introduced at a flow rate of 150 sccm to form CF film 13 having an F content of, for example, 22% on silicon substrate 11. This CF film 13 has a relative dielectric constant of 2.4.

8 Claims, 16 Drawing Sheets

FOREIGN PATENT DOCUMENTS

| | | |
|---|---|---|
| 63-233549 | 9/1988 | (JP) . |
| 1-302813 | 12/1989 | (JP) . |
| 2-107774 | 4/1990 | (JP) . |
| 3-3380 | 1/1991 | (JP) . |
| 4-271122 | 9/1992 | (JP) . |
| 6-163479 | 6/1994 | (JP) . |
| 6-196421 | 7/1994 | (JP) . |
| 6-338465 | 12/1994 | (JP) . |
| 8-83842 | 3/1996 | (JP) . |
| 9-45688 | 2/1997 | (JP) . |

OTHER PUBLICATIONS

Grill et al., *Wear Resistant Fluorinated Diamondlike Carbon Films*, Diamond Films and Technology, vol. 6, No. 1, pp. 13–21 (1996).

Endo et al., *Low–k Fluorinated Amorphous Carbon Interlayer Technology for Quarter Micron Devices*, 1996 IEEE International Electron Devices Meeting, p. 369–372 (1996).

H. Kudo, et al., "Characteristics of Plasma–CF films for Very Low–k Dielectrics".

S. Takeishi, et al., "Fluorocarbon Films Deposited by PECVD with High Thermal Resistance and Low Dielectric Constants".

W. Lee, et al., "Plasma Polymerization of Low Dielectric Constant Fluorocarbon Polymer by ECR".

K. Endo, et al., "Effect of Bias Addition on the Gap–Filling Properties of Fluorinated Amorphous Carbon Thin Films Grown by Helicon Wave Plasma Enhanced Chemical Vapor Deposition".

* cited by examiner

| RELATIVE DIELECTRIC CONSTANT | F CONTENT (atomic%) |
|---|---|
| 1.9 | 72 |
| 2.0 | 66 |
| 2.1 | 42 |
| 2.3 | 25 |
| 2.5 | 18 |
| 2.9 | 8 |
| 3.0 | 5 |
| 3.1 | 4 |
| 3.5 | 2 |
| 4.0 | 0 |

FIG.2

| ADHESION (kg/cm²) | F CONTENT (atomic%) |
|---|---|
| 165.0 | 72 |
| 185.0 | 66 |
| 210.0 | 42 |
| 310.0 | 25 |
| 480.0 | 18 |
| 510.0 | 8 |

FIG.3

| HARDNESS | F CONTENT (atomic%) |
|---|---|
| 24 | 72 |
| 42 | 66 |
| 59 | 42 |
| 123 | 25 |
| 210 | 18 |
| 250 | 8 |

FIG.4

| STRUCTURE OF FILM | ADHESION (kg/cm$^2$) |
|---|---|
| SINGLE-LAYER FILM | 505 |
| a-C TWO-LAYER FILM | 906 |
| SiC TWO-LAYER FILM | 1035 |
| a-C COMPOSITE GLADIENT FILM | 916 |
| SiC COMPOSITE GLADIENT FILM | 1079 |

FIG.13

| STRUCTURE OF FILM | ADHESION (kg/cm²) |
|---|---|
| SINGLE-LAYER FILM | 210 |
| TWO-LAYER FILM | 230 |
| a-C / C-F / a-C | 850 |
| SiC / CF / a-C | 890 |
| a-C / C-F / SiC | 1035 |
| SiC / CF / SiC | 1079 |

|  | PROCESSING TIME (sec) | | | | | |
| --- | --- | --- | --- | --- | --- | --- |
|  | 0 | 5 | 10 | 15 | 30 | 60 |
| BARE SILICON | × | × | ○ | ○ | ○ | ○ |
| Th-SiO$_2$ | × | × | ○ | ○ | ○ | ○ |

FIG.20

|  | RADIOFREQUENCY POWER (W) | | |
| --- | --- | --- | --- |
|  | 100 | 200 | 500 |
| BARE SILICON | × | ○ | ○ |
| Th-SiO$_2$ | × | ○ | ○ |

FIG.21

|  | Ar GAS FLOW RATE (sccm) | | |
| --- | --- | --- | --- |
|  | 100 | 150 | 300 |
| BARE SILICON | × | ○ | ○ |
| Th-SiO$_2$ | × | ○ | ○ |

FIG.22

SEMICONDUCTOR DEVICE AND METHOD FOR PRODUCING THE SAME

TECHNICAL FIELD

The present invention relates to a semiconductor device provided with a dielectric film comprising fluorocarbon film, and to a method for producing such a semiconductor device.

BACKGROUND ART

In order to increase the degree of integration of semiconductor devices, some means such as the formation of more minute patterns, and the production of multilayered circuits are now being devised. As one of these means, there is a technology in which wiring layers are formed as multiple layers. In order to attain multi-layer interconnection structure, an wiring layer of layer number n and that of layer number (n+1) are connected by a conductive layer, and, at the same time, a thin film called interlayer dielectric film is formed in the region other than the conductive layer.

$SiO_2$ film has been known as a representative of this interlayer dielectric film. In recent years, however, it is required to decrease the relative dielectric constant of the interlayer dielectric film in order to further increase the speed of device operation, and studies are now being made on materials suitable for the interlayer dielectric film. Namely, the relative dielectric constant of $SiO_2$ is approximately "4", and energy is now being directed to the investigation of materials whose relative dielectric constants are lower than this value. As one of such materials, SiOF whose relative dielectric constant is "3.5" is now being tried to put into practical use. However, we are paying attention to fluorocarbon film whose relative dielectric constant is lower than this.

The interlayer dielectric film is required to have not only a low relative dielectric constant but also high adhesion, high mechanical strength, excellent thermal stability and the like. Teflon (trade name) (polytetrafluoroethylene) is well known as fluorocarbon. However, this one is extremely poor in adhesion, and also has low hardness. Therefore, even if it is tried to use fluorocarbon film as the interlayer dielectric film, there are many unknown points regarding the quality of the film, and it is difficult to put fluorocarbon film into practical use under the present conditions.

DISCLOSURE OF THE INVENTION

The present invention was accomplished under such circumstances. An object of the present invention is to provide a semiconductor device provided with a dielectric film having a relative dielectric constant of "2.5" or lower, comprising fluorocarbon film containing 18 to 66% of fluorine, and a method for producing such a semiconductor device.

A semiconductor device of the present invention is therefore characterized by comprising a dielectric film which comprises fluorocarbon film containing 18 to 66% of fluorine. Further, the semiconductor device may also be constructed by providing, on the top surface of a first dielectric film made of fluorocarbon film, a second dielectric film having hardness higher than that of the first dielectric film. In this case, it is desirable that the second dielectric film be silicon dioxide film.

Furthermore, the semiconductor device may also be constructed by providing, on the underside of the first dielectric film made of fluorocarbon film, a lower dielectric film containing carbon, having adhesion higher than that of the first dielectric layer; or by providing, on the top surface of the first dielectric film, an upper dielectric layer containing carbon, having adhesion higher than that of the first dielectric layer. Moreover, in a semiconductor device in which a dielectric layer is formed on a circuit area, and a plurality of wiring layers and of interlayer dielectric films are laminated on this dielectric layer, the interlayer dielectric films may be formed by using fluorocarbon film, and, at the same time, a thin film containing carbon, having adhesion higher than that of the fluorocarbon film may be formed between the dielectric layer and the fluorocarbon film and/or between the fluorocarbon films. In this case, it is desirable that the lower dielectric film and the upper dielectric film be hydrogenated amorphous carbon films, silicon carbide films, or films composed of carbon, hydrogen and fluorine, in which the fluorine content becomes higher toward the upper part.

In the case where a semiconductor device is constructed by laminating such a dielectric film made of fluorocarbon film, and the dielectric film containing carbon, having adhesion higher than that of the above fluorocarbon film, it is desirable to produce the semiconductor device by a method for producing a semiconductor device, employing, for example, a plurality of vacuum processing chambers, and a carrier chamber provided with a carrier member for carrying a substrate to be processed from one vacuum processing chamber to another vacuum processing chamber, and forming dielectric films by using plasmas created from film-forming gases in the vacuum processing chambers, wherein the method comprises the first step of creating a plasma from a first film-forming gas in a vacuum processing chamber, and forming, on a substrate to be processed, a dielectric film by the use of this plasma, and the second step of carrying the substrate to be processed, on which the dielectric film has been formed, from the vacuum processing chamber in which the first step has been effected to a vacuum processing chamber which is different from the above one by the carrier member, and forming, in this vacuum processing chamber, a dielectric film on the dielectric film which has been formed in the first step, by using a plasma created from a second film-forming gas.

Further, in a semiconductor device in which a protective film is formed on the outermost shell of a semiconductor chip, the protective film may be formed by using fluorocarbon film, and, by controlling the fluorine content of the fluorocarbon film, the inner part of the protective film may be formed by fluorocarbon film having high moisture resistance, and the surface side of the protective film may be formed by fluorocarbon film which is excellent in the property of relaxing stress. In this case, the fluorocarbon film having high moisture resistance desirably contains 40 to 72% of fluorine, and the fluorocarbon film which is excellent in the property of relaxing stress desirably contains 8 to 40% of fluorine.

Furthermore, a method for producing a semiconductor device according to the present invention is characterized by comprising the step of creating a plasma from a pretreatment gas consisting of, for instance, a rare gas or hydrogen-plasma-creating gas, and applying this plasma to a surface to be processed, on which fluorocarbon film is tried to be formed, to form irregularities on the surface to be processed, and the step of creating a plasma from a film-forming gas, and forming, by the use of this plasma, fluorocarbon film on the surface to be processed. In this case, it is desirable to create the plasma from the pretreatment gas by interaction between microwave and magnetic field.

Furthermore, a method for producing a semiconductor device according to the present invention is characterized by comprising the step of forming titanium nitride layer on aluminum, the step of forming an wiring layer by etching the aluminum on which the titanium nitride layer has been formed, and the step of applying nitrogen plasma and/or oxygen plasma to the above-formed wiring layer.

BRIEF DESCRIPTION OF THE DRAWINGS

FIG. 2 is a table showing the relationship between the F content and relative dielectric constant of fluorocarbon film (CF film).

FIG. 3 is a table showing the relationship between the F content and adhesion of CF film.

FIG. 4 is a table showing the relationship between the F content and hardness of CF film.

FIG. 13 is a table showing the results of the measurement of the adhesion of two-layer films.

FIG. 20 is a table showing the relationship between adhesion and processing time.

FIG. 21 is a table showing the relationship between adhesion and radiofrequency power.

FIG. 22 is a table showing the relationship between adhesion and Ar gas flow rate.

BEST MODE FOR CARRYING OUT THE INVENTION

Figure 1:
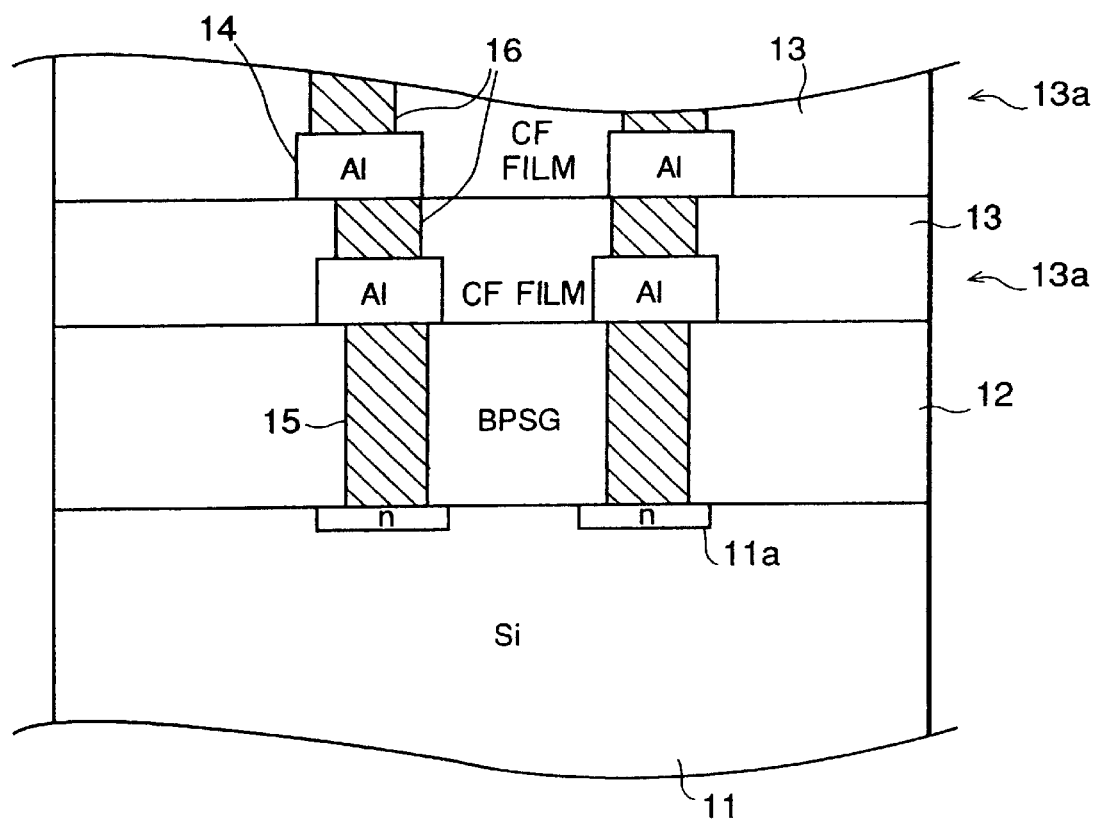
FIG. 1 is a sectional view showing one example of semiconductor device according to an embodiment of the present invention.

First of all, a semiconductor device of multiple wiring layer structure according to an embodiment of the present invention will be explained by referring to FIG. 1. In this figure, reference numeral 11 denotes a silicon substrate. On a surface of this silicon substrate, a BPSG layer 12 is formed. This BPSG layer functions as a dielectric layer, and is formed by using a material containing boron (B), phosphorus (P) and silicate glass (SG). The thickness of this layer is, for instance, approximately 10000 angstroms.

On the surface of the BPSG flayer 12 is formed an interlayer dielectric film 13a having a thickness of, for example, approximately 8000 angstroms. On the back surface of this interlayer dielectric film 13a, aluminum (Al) wiring layer 14 having, for example, a width of 5000 angstroms and a thickness of 5000 angstrom is formed. In the multiple wiring layer structure, such an interlayer dielectric film 13a is formed in a plurality of rows, for examples, in 4 rows.

In the above-described BPSG layer 12, a contact hole 15 having a groove width of 5000 angstroms is formed between an n-type semiconductor layer 11a formed on the surface of the silicon substrate 11, and the Al wiring layer 14 formed in the interlayer dielectric film 13a. Further, in the above-described interlayer dielectric film 13a, a via hole 16 having a groove width of 5000 angstroms is formed between the Al wiring layer 14 formed on this row and the Al wiring layer 14 formed in the interlayer dielectric film 13a on the upper row. In these contact hole 15 and via hole 16, for example, tungsten (W) is embedded, whereby a conductive layer for connecting the wiring layers is formed.

In this embodiment, the above-described interlayer dielectric film 13a comprises a fluorocarbon film 13 (hereinafter referred to as CF film). This CF film will now be explained. The reason why we paid attention to this CF film is as follow: in order to meet the demand for devices capable of operating at higher speed, the interlayer dielectric film is required to have a relative dielectric constant of "3" or less, preferably "2.5" or less as mentioned previously; and, since the relative dielectric constant of Teflon is "2", we considered that the relative dielectric constant could be decreased if a film containing C (carbon) and F (fluorine), the composition thereof being close to that of Teflon, would be formed.

By the use of a plasma processing system which will be described later, we formed various CF films having different F contents by changing processing conditions, and measured the relative dielectric constants of these films. As a result, the relationship as shown in FIG. 2 was found between the F content and relative dielectric constant. Namely, it was found that, in order to obtain a relative dielectric constant of "3" or less, it is proper to use, for a high-speed device, CF film 13 having an F content of 5% or more as the interlayer dielectric film 13a, and that, in order to obtain a relative dielectric constant of "2.5" or less, it is suitable to use CF film having an F content of 18% or more. The F content as used herein means the ratio of the number of F atoms to the total number of all atoms contained in CF film 13, that is, atomic %.

As a means for measuring the F content of CF film 13, Rutherford back scattering spectroscopy was used. The principle of this method is that, by applying high-energy ion to the surface of a solid, and measuring the energy and yield of those ions scattered backward, the information of the inside of the solid is obtained. Further, the measurement of relative dielectric constant was carried out by forming CF film 13 on the surface of bare silicon, forming aluminum electrode on top of the CF film 13, and connecting the silicon layer and the electrode by the electrode of a relative dielectric constant meter.

A film is required to have excellent adhesion and high hardness when it is used for the interlayer dielectric film 13a, so that the adhesion and hardness of the above-described CF film 13 were measured. As a result, the relationship as shown in FIG. 3 was found between F content and adhesion; and the relationship as shown in FIG. 4 was found between F content and hardness.

The measurement of adhesion was carried out in the following manner: the CF film 13 was formed on the surface of bare silicon, and a lug for adhesion test was fixed to the surface of this CF film by using an adhesive; the lug was pulled up, and the pulling force per unit area of the lug (kg/cm$^2$) at the time when the CF film was released from the bare silicon was taken as an index of adhesion (the Sebastian method). The hardness of the CF film 13 was measured by an indentation test that was carried out by using a Shimadzu Dynamic Ultra-small Hardness Meter DUH-200, and a trigonal pyramidal indenter having a sharpness of 115 degrees, the curvature radius of the tip of the indenter being 0.1 μm or smaller, under the conditions of a test load of 500 mgf, a loading rate of 29 mgf/sec, and a test load retention time of 5 sec. Coefficient (37.838)×load/D$^2$ was taken as an index of hardness, where D (μm) is the depth of the indent.

It was found from the above results that, as long as the adhesion of the CF film in the above-described test is 200 kg/cm$^2$ or more, there is no possibility that the CF film incorporated into a device peels off, so that it is proper to form the CF film 13 having an F content of 66% or less. Further, with respect to hardness, when the hardness of the CF film 13 is excessively low, the etch back step in which the surface of the film is levelled by means of, for example, mechanical polishing cannot be effected easily. It is therefore necessary that the hardness of the CF film 13 be 40 or more, preferably 50 or more. It was thus found that it is proper to form CF film 13 having an F content of 66% or less.

From these results, it is realized that, in order to make the relative dielectric constant of the CF film low, it is proper to make the F content of the CF film high but that, when the F content is excessively high, the adhesion of the CF film becomes poor and the hardness of the same becomes low. The reason for this is considered that the adhesion and hardness of the CF film are conjectured to be related to C—C bond in the film and that C—C bond is decreased when the F content is increased. It is therefore desirable to make the F content 8 to 66% in order to make the relative dielectric constant low and to ensure sufficient adhesion and hardness.

Subsequently, a method for producing such CF film 13 will be explained. First of all, one example of plasma processing system that is used for producing the CF film 13 will be explained by referring to FIG. 5. As shown in this figure, this plasma processing system contains a vacuum vessel 2 made of aluminum or the like. This vacuum vessel 2 is composed of a plasma chamber 21 in which a plasma is created, and a film-forming chamber 22 provided under the plasma chamber 21, the plasma chamber 21 and the film-forming chamber 22 communicating with each other. It is noted that this vacuum vessel 2 is grounded, and has an electric potential of zero.

At the top of this vacuum vessel 2, transmission apertures 23 made from a material capable of transmitting microwave are provided densely to keep the inside of the vessel 2 vacuum. At the outside of the transmission apertures 23, there is provided a waveguide 25 that is connected to a radiofrequency generator 24 serving as a means for feeding, for example, 2.45 GHz of radiofrequency wave for creating a plasma so that microwave M generated by the radiofrequency generator 24 can be guided by the waveguide 25 and introduced into the plasma chamber 21 through the transmission apertures 23.

On the partitioning sidewall of the plasma chamber 21 are provided plasma gas nozzles 26 which are arranged uniformly, for example, along the perimeter of the plasma chamber 21. To these nozzles 26, a plasma gas source, for instance, Ar or $O_2$ gas source, which is not shown in this figure, is connected so that a plasma gas of Ar or $O_2$ gas can be uniformly fed to the upper part of the plasma chamber 21. It is noted that, although only two nozzles 26 are shown in the figure in order to avoid complexity, more than two nozzles 26 are provided in practice.

On the outer periphery of the partitioning sidewall of the plasma chamber 21, primary magnetic coil 27 in the shape of, for example, a ring is provided in the vicinity of the plasma chamber 21 as a means for producing magnetic field, and secondary magnetic coil 28 in the shape of a ring is provided under the film-forming chamber 22 so that magnetic field B of, for example, 875 gauss, can be produced in the direction of from top to bottom throughout the plasma chamber 21 and the film-forming chamber 22 to fulfill the ECR plasma conditions. It is noted that permanent magnet can be used instead of the magnetic coils.

By thus producing both microwave M with a controlled frequency and magnetic field B in the plasma chamber 21, the above-described ECR plasma is created by interaction between them. At this time, the above-described gas introduced causes resonance at the above-described frequency, so that a plasma is created at high density. Namely, this system is to constitute an electron cyclotron resonance (ECR) plasma processing system. On the other hand, at the upper part of the above-described film-forming chamber 22, that is, at a part through which the film-forming chamber 22 communicates with the plasma chamber 21, a film-forming gas feed section 30 in the form of a ring is provided so that film-forming gases can be jetted from the inner face of the film-forming chamber 22. Further, in the film-forming chamber 22, a stage 3 is provided so that it can freely go up and down. This stage 3 is composed of a static chuck 32 containing therein a heater which is placed on a body 31 made of, for example, aluminum. To the electrode (chuck electrode) 33 of this static chuck 32, for example, a radiofrequency generator 34 is connected so that bias voltage can be applied to a wafer W in order to attract ions thereto. Further, an exhaust tube 35 is connected to the film-forming chamber 22 at the bottom thereof.

Next, a method for forming, on a wafer 10 which is a substrate to be processed, an interlayer dielectric film 13 made of the CF film by the use of the aforementioned system. First of all, a wafer 10, a substrate to be processed, having, for example, an aluminum wiring layer on the surface thereof is placed on the stage 3 by carrying it from a load-lock chamber, which is not shown in the figure, by means of a carrier arm, which is not shown in the figure, by opening a gate valve, which is not shown in the figure, provided on the sidewall of the vacuum vessel 2.

Subsequently, this gate valve is closed airtightly, and the atmosphere in the vacuum chamber is exhausted through the exhaust tube 35 to a predetermined degree of vacuum. A plasma gas, for example, Ar gas is then introduced into the plasma chamber 21 through the plasma gas nozzles 26, and, at the same time, film-forming gases, for example, $C_4F_8$ gas and $C_2H_4$ gas are introduced into the film-forming chamber 22 from the film-forming gas feed section 30 at flow rates of 60 sccm and 30 sccm, respectively. The inside of the vacuum vessel 2 is maintained at a processing pressure of 0.1 Pa. At the same time, a bias voltage of 13.56 MHz and 1500 W is applied to the stage 3 by the radiofrequency generator 34 for plasma creation, and the surface temperature of the stage 3 is set at 320° C.

2.45 GHz of radiofrequency wave (microwave) M generated by the radiofrequency generator 24 for plasma creation travels in the waveguide 25, and enters in the plasma chamber 21 through the transmission apertures 23. To the inside of this plasma chamber 21, magnetic field B produced by the primary magnetic coil 27 and secondary magnetic coil 28, which are provided at the outside of the plasma chamber 21, is applied in the direction of from top to bottom with an intensity of 875 gauss, and, by interaction between these magnetic field B and microwave M, E (electrical field)×H (magnetic field) is induced to cause electron cyclotron resonance. By this resonance, the Ar gas is made into a plasma, and highly densified. It is noted that a stabilized plasma can be created by the use of Ar gas.

A flow of the plasma entered in the film-forming chamber 22 from the plasma-creating chamber 21 activates the $C_4F_8$ gas and $C_2F_4$ gas which have been fed to the film-forming chamber 22, thereby forming active species (plasma). On the other hand, the plasma ions, Ar ions in this example, are attracted to the wafer 10 by the bias voltage for plasma attraction, and abrade the corner of a pattern (indented part) on the surface of the wafer 10 to increase the width of the pattern. In parallel with this sputter etching action, the CF film is formed by the active species, and embedded in the indented part.

The F content, relative dielectric constant, adhesion and hardness of the CF film 13 thus formed were measured by the previously-mentioned methods. As a result, the F content was found to be 22%; the relative dielectric constant was found to be "2.4"; the adhesion was found to be 412; and the hardness was found to be 192. It was thus confirmed that this film was favorable as the interlayer dielectric film 13a.

In the above-described production method, CF films 13 having various compositions, the F contents thereof being different, can be formed by using, as film-forming gases, $C_nF_m$ gas and $C_kH_s$ gas (n, m, k and s are an integer) in combination. In this case, $CF_4$, $C_2F_6$, $C_3F_8$, $C_4F_8$ or the like can be used as the $C_nF_m$ gas; and $H_2$, $CH_4$, $C_2H_2$, $C_2H_6$, $C_3H_8$, $C_4H_8$ or the like can be used as the $C_kH_s$ gas. Further, in addition to the $C_nF_m$ gas and $C_kH_s$ gas, $H_2$ gas may also be added. Furthermore, CF films 13 having various F contents can be formed by changing the flow rates of these film-forming gases.

As the film-forming gases herein used, double-bond or triple-bond gases, for example, $C_2F_2$ gas and $C_2F_4$ gas may be used as CF source gases. Alternatively, gases in which four CF groups are bonded to one C, for example, $C(CF_3)_4$ and $C(C_2F_5)_4$ may be used either singly or in combination with the previously-mentioned $C_4F_8$ gas or $C_2F_8$ gas, or the like. Further, CHF gases, for instance, $CH_3(CH_2)_3CH_2F$, $CH_3(CH_2)_4CH_2F$, $CH_3(CH_2)_7CH_2F$, $CHCH_3F_2$, $CHF_3$, $CH_3F$, $CH_2F_2$ and the like may also be used as source gases.

In the case where the types and flow rates of film-forming gases are the same, CF films 13 having various F contents can be formed by changing the microwave power, the temperature of the stage, or the pressure or bias electric power in the vacuum vessel 2. For example, if the other conditions are the same, when the temperature of the stage is made higher, the F content becomes lower; and when the pressure is made higher, or when the microwave power is made greater, or when the bias electric power is made greater, the F content becomes lower.

Figure 6:
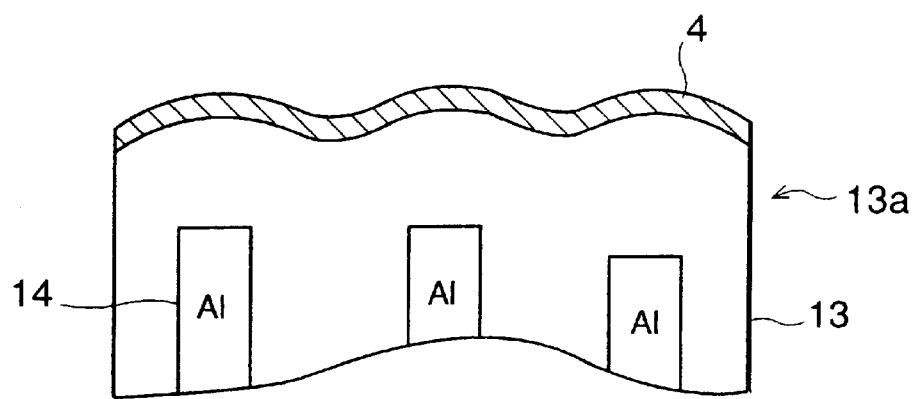
FIG. 6 is a sectional view of CF film according to another embodiment of the present invention.

Subsequently, another embodiment of the present invention will be explained. The difference between this embodiment and the above-described embodiment is that a capping film 4, or a second dielectric film, is formed on the top surface of the above-described CF film 13, or a first dielectric film, as shown, for example, in FIG. 6. This capping film 4 is made of a dielectric layer of, for example, $SiO_2$, SiOF, SiBN, SiN, SiC, a—C:H (hydrogenated amorphous carbon film, hereinafter referred to as "a—C"), BN or the like, and has a thickness of, for example, 100 angstroms or more.

After the CF film 13 is formed on a wafer 10 by the above-described method, this capping film 4 is formed on the CF film 13 by effecting film-forming processing in the above-described plasma processing system, by changing processing conditions such as film-forming gases, microwave power, pressure, and stage temperature. For example, in the case where $SiO_2$ film is formed as the capping film 4, film-forming processing is effected by introducing $SiH_4$ gas as a film-forming gas at a flow rate of 80 sccm under the conditions of a microwave power of 2000 W, a pressure of 0.27 Pa, and a stage temperature of 200° C.

When the capping film 4 is thus formed on the CF film 13, there can be obtained such an effect that thermal stability is improved. The thermal stability herein means that only a few F falls off even at elevated temperatures. Namely, in the semiconductor device shown in FIG. 1, the via hole 16 is formed after the formation of the CF film 13, and, for example, W is embedded therein in order to electrically connect the Al wiring layer 14 in the upper row with that in the lower row. This embedding step is effected at a temperature of approximately 450° C. Further, there is such a case where Al is poured into the via hole 16. This reflow step is effected at a temperature of approximately 400° C. or higher.

When the CF film 13 is heated to a temperature higher than the film-forming temperature, F falls off. However, when the capping film 4 is formed on the surface of the CF film 13, F hardly falls off. This is because, since the capping film 4 is more dense than the CF film, F cannot easily pass through this capping film 4. When F falls off greatly, the relative dielectric constant of the CF film is increased, and the CF film tends to peel off due to the shrinkage of the CF film itself. Moreover, since F falls off as a gas, separation tends to occur at the interface between the CF film and the W film, and Al may corrode in the presence of F, and Cl which is used for etching the Al wiring layer 14. It is therefore desirable that the thermal stability be high.

Further, since a dielectric layer of $SiO_2$, SiOF, SiBN, SiN, SiC, a—C, BN or the like has a hardness of approximately 588.5, which is higher than that of CF film, the following effects can be obtained in the subsequent CMP step in the case where the capping film 4 is provided on the surface of the CF film 13. This CMP step is effected after the CF film 13 is formed on the wafer 10 on which Al wiring layer 14 has been provided, in order to level the surface of the CF film 13 by abrading those parts which are needless. This step is effected, for example, in the following manner: a sheet of abrasive cloth made from polyurethane or the like is adhered to a rotating pad, and brought into pressure contact with the wafer 10; and the wafer 10, an object of abrasion, is abraded by rotating the rotating pad, with the aid of an abrasive agent which is fed to the surface of the abrasive cloth.

An action of CMP that is obtained in the case where no capping film 4 is formed on the surface of the CF film 13 is firstly explained. The CMP step is effected in order to abrade, by means of abrasion, a protrudent region 41 shown by slant lines in FIG. 7(a). Since the abrasive cloth is soft, it can abrade the protrudent region 41 while being in close contact with the protrudent region 41. In this case, however, when the difference in level between the protrudent region 41 and the other region 42 becomes small as the abrasion of the protrudent region 41 proceeds, the abrasive cloth also touches the region 42. Therefore, this region 42 is also abraded. Thus, when CMP is conducted, although the difference in level between the protrudent region 41 and the other region 42 becomes small, the thickness of the region 42 becomes small.

Figure 7:
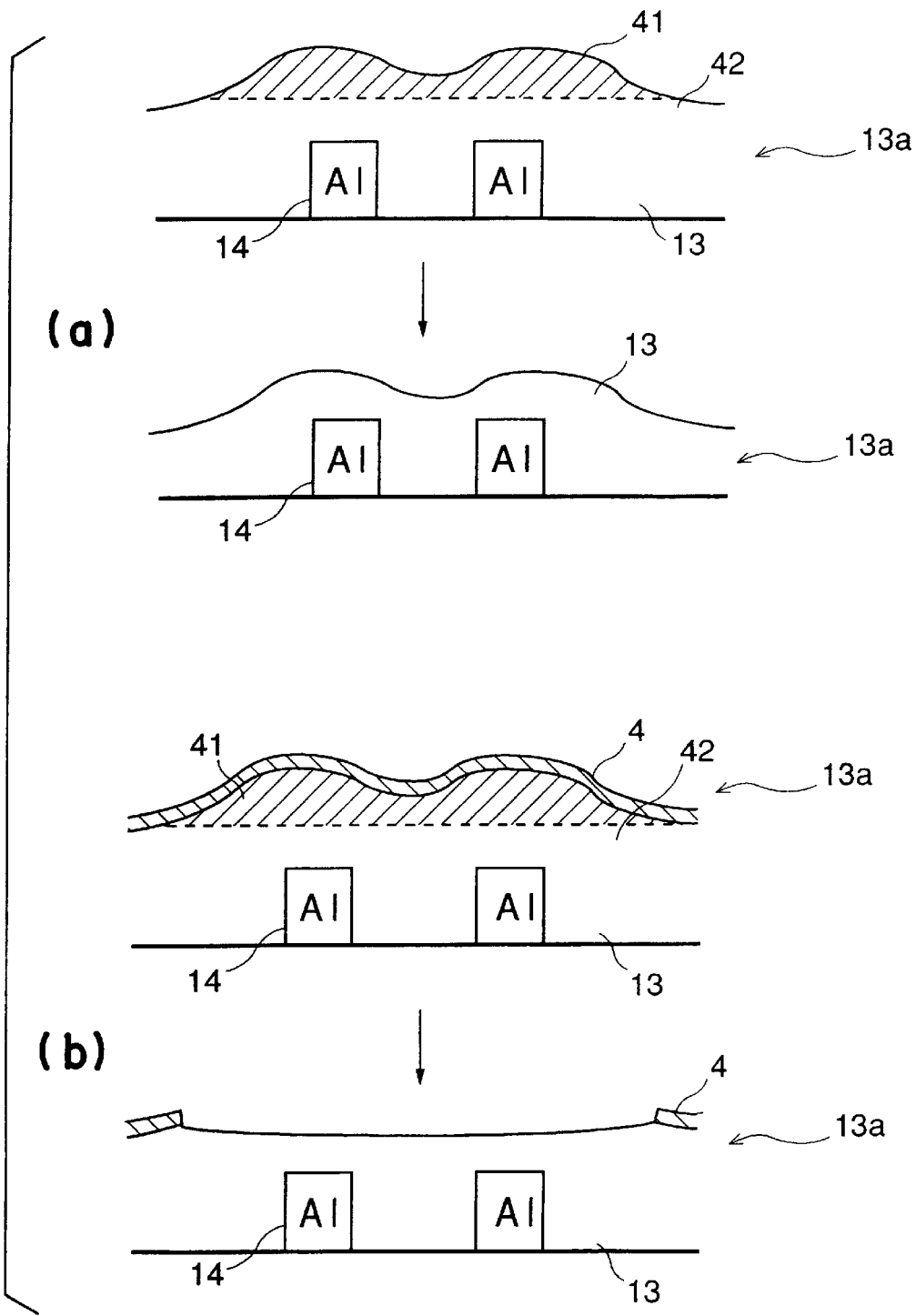
FIG. 7 is an explanatory view for explaining the effect which can be obtained when a capping film is formed.

On the other hand, in the case where the capping film 4 is formed on the surface of the CF film 13, a protrudent region 41 shown by slant lines in FIG. 7(b) is abraded by abrasion at the initial stage of CMP. At this time, the capping film 4 is firstly abraded, and the CF film 13 is then abraded. When the difference in level between the protrudent region 41 and the other region 42 becomes small as the abrasion proceeds, the abrasive cloth also touches the capping film 4. However, the hardness of the capping 4 is higher than that of the CF film 13, so that there is no possibility that the other region 42 is also abraded together with the protrudent region 41. The thickness of the other region 42 is thus prevented from becoming small.

Figure 8:
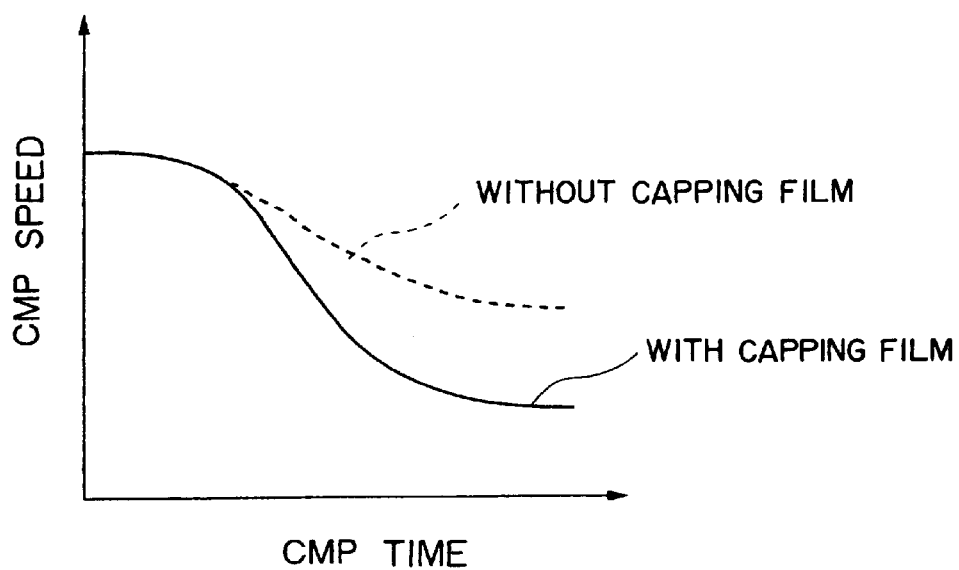
FIG. 8 is a characteristics diagram for explaining the effect which can be obtained when a capping film is formed.

Further, when the top surface of the protrudent region 41 and that of the other region 42 become on the same level after the protrudent region 41 is abraded, the capping film 4 is abraded. Since the capping film 4 is harder than the CF film 13 as mentioned previously, the speed of abrasion becomes low. In FIG. 8, the change in CMP speed with time in the case where the capping film 4 is formed, and the change in the same in the case where no capping film 4 is formed are shown by a solid line and a dotted line, respectively. As shown in this figure, the CMP speed is high while the protrudent region 41 is abraded, and gradually becomes low as the abrasion proceeds. In the case where the capping film 4 is formed, the degree of lowering of the CMP speed is great. Therefore, the lowering of the CMP speed can easily be known, so that the termination point of the CMP step can easily be decided. It is thus possible to prevent insufficient or excessive abrasion, and the CF film can be leveled more uniformly.

Furthermore, when the capping film 4 is provided, since the CF film 13 is in such a state that the surface thereof is protected with the hard capping film 4, there can also be obtained such an effect that the handling properties during transportation are improved. The reason why it is preferable to make the thickness of the capping film 4 100 angstroms or more is to avoid such a possibility that a region in which the capping film 4 is not formed will be produced, which region tends to be produced when it is tried to make the thickness of the capping film 4 approximately 50 angstroms. Further, $SiO_2$ or the like has a relative dielectric constant of "4", which is higher than that of the CF film 13. The thickness of the capping film 4 made of such a substance is 100 angstroms, while the thickness of the CF film 13 is 8000 angstroms. The capping film 4 is thus much thinner than the CF film 13, so that the influence of the capping film 4 on the relative dielectric constant of the CF film 13 is almost negligible.

An experimental example which was carried out in order to confirm the effect of this embodiment will now be explained. The CF film having a thickness of 8000 angstroms was formed by the use of the plasma-assisted film-forming system shown in FIG. 5, by introducing thereto $C_4F_8$ gas and $C_2H_4$ gas as film-forming gases under the same processing conditions as in the previously-mentioned embodiment. Subsequently, a capping film having a thickness of 100 angstroms, made of $SiO_2$ film was formed by introducing $SiH_4$ gas as a film-forming gas at a flow rate of 80 sccm under the conditions of a microwave power of 2000 W, a pressure of 0.27 Pa, and a stage temperature of 200° C. The TDS spectra (Thermal Disorption Spectroscopy: thermal desorption gas analysis method) of this CF film provided with the capping film were measured. Further, the TDS spectra of the CF film 13 having no capping film which was formed under the same conditions as those described above were also measured. The results are shown in FIG. 9 and FIG. 10, respectively.

Figure 9:
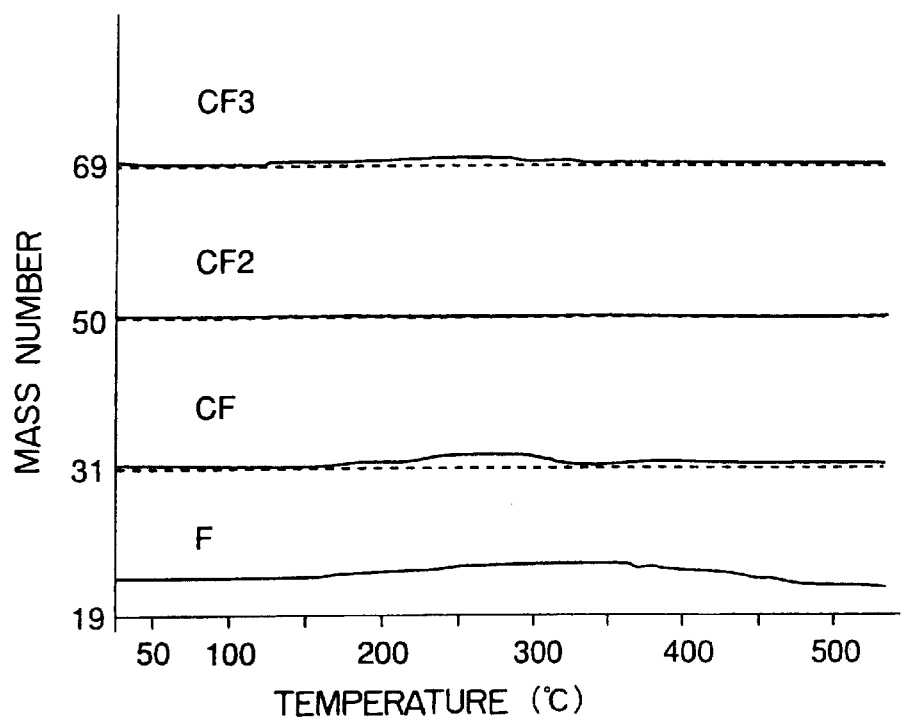
FIG. 9 is a characteristics diagram showing the TDS spectra of CF film.
Figure 10:
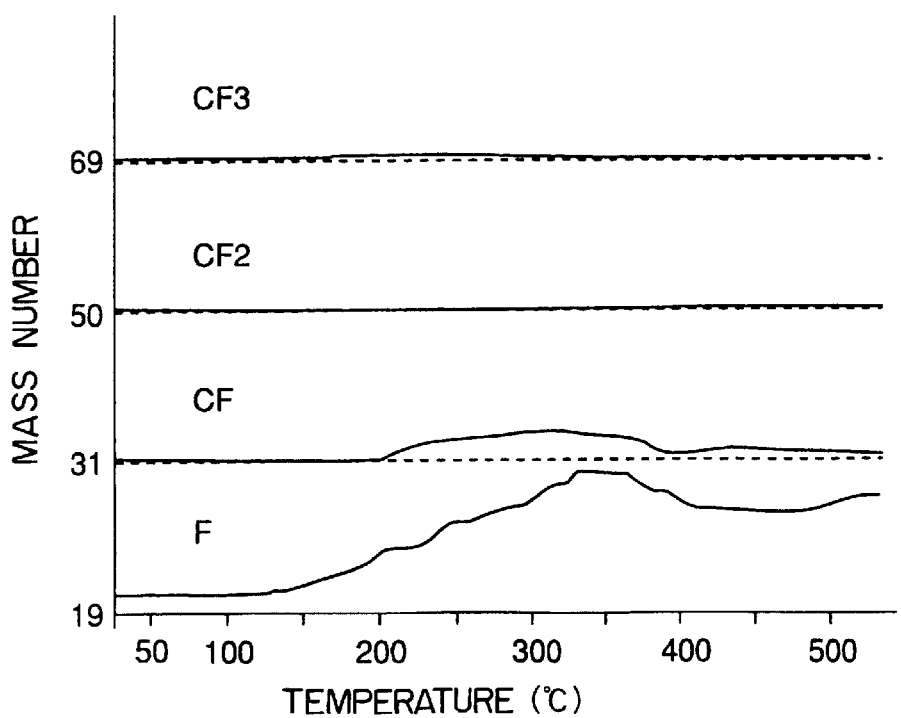
FIG. 10 is a characteristics diagram showing the TDS spectra of CF film.

The TDS spectra in FIG. 9 show the spectra of the CF film 13 provided with the capping film 4; and FIG. 10 shows the spectra of the CF film 13 having no capping film 4. In these spectra, the quantities of gases evaporated from the CF films 13 when the CF films 13 are heated are shown. From these figures, it can be known that the quantities of CF and F which are evaporated from the CF film 13 having the capping film 4 are smaller than those of the gases evaporated from the CF film 13 having no capping film 4. Form this result, it was confirmed that the capping film 4 is effective for thermal stability.

Further, the relative dielectric constant of the CF film 13 having the capping film 4 and that of the CF film 13 having no capping film 4 were measured. The relative dielectric constant of the CF film 13 having the capping film 4 was found to be 2.41, while that of the CF film 13 having no capping film 4 was found to be 2.40. It was thus confirmed that, even if the capping film is formed, the relative dielectric constant is not so increased.

Figure 11:
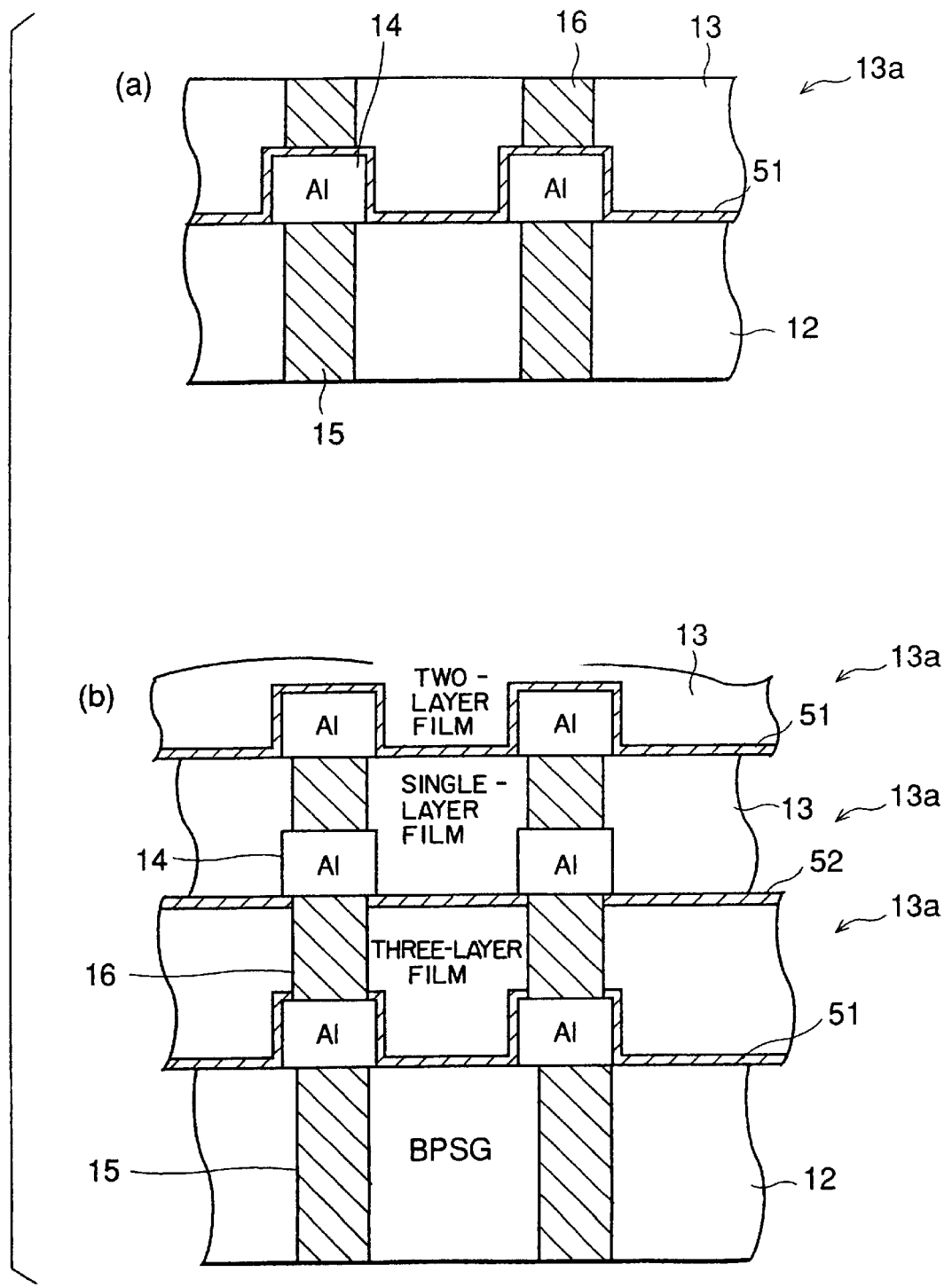
FIG. 11 is a sectional view showing one example of semiconductor device according to another embodiment of the present invention.

Subsequently, still another embodiment of the present invention will be explained. The difference between this embodiment and the above-described embodiment is that the CF film 13 is made to have a multilayered structure. The multilayered structure as used herein refers to a two-layer film having two-layer structure which is obtainable by forming a lower film 51, lower dielectric film, on the underside of the CF film 13 as shown in FIG. 11(a); or a three-layer film having three-layer sandwitched structure which is obtainable by forming a lower film 51 on the underside of the CF film 13, and an upper film 52, upper dielectric film, on the top surface of the CF film 13 as shown in FIG. 11(b).

As the lower film 51 in the above-described two-layer film, it is possible to use a film having high adhesion, such as SiC film, a—C film, additional CF film having an F content of 8% or less, or a film in which the lower part is made of a—C, and the F content gradually becomes higher toward the upper part (hereinafter referred to as "gradient film"). Further, as the results of the experiments which will be described later demonstrate, when the thicknesses of these films are made greater, more improved adhesion can be obtained, but the relative dielectric constants of the films also tend to be increased. For this reason, it is desirable to make their thicknesses from 100 to 1000 angstroms. Further, the CF film 13 in the two-layer film is formed to have a thickness of approximately 10000 angstroms, and an F content of, for example, 8 to 72%.

As the lower film 51 and upper film 52 in the above-described three-layer film, a film that is the same as the lower film 51 in the two-layer film can be used. However, it is desirable to make the thickness of the lower film 51 100 to 1000 angstroms, and that of the upper film 52 100 to 1000 angstroms. Further, the CF film 13 in the three-layer film is formed to have a thickness of approximately 10000 angstroms, and an F content of, for example, 8 to 72%.

The above-described two-layer film is formed, in the above-described plasma processing system, by firstly forming the lower film 51 on the wafer 10, and then forming the CF film 13 on top of this lower film 51. Further, the three-layer film is formed by forming a two-layer film in the same manner as the above, and then forming the upper film 52 on top of the CF film 13. In this method, a—C film is formed by using, as a film-forming gas or gases, $C_kH_s$ gas only, or $C_kH_s$ gas and $H_2$ gas; SiC film is formed by using $C_kH_s$ gas and $SiH_4$ gas ($Si_2H_6$ gas, $SiF_4$ gas); and a gradient film is formed by introducing $C_nF_m$ gas and $C_kH_s$ gas into the film-forming chamber 22 while varying the flow rates thereof.

In the above-described two-layer film, the lower film 51 is formed by using a film having high adhesion. Therefore, the adhesion between the two-layer film and a layer which is positioned under it, for example, the BPSG layer 12 in the case of an example shown in FIG. 11(a), is increased. As mentioned previously, when the relative dielectric constant of the CF film 13 is decreased, the adhesion between the CF film 13 and the BPSG layer 12 or the silicon substrate 11 tends to be lowered. Therefore, in the case where the CF film 13 is used as a single layer, the CF film 13 peels off the BPSG layer 12 when the relative dielectric constant of the CF film 13 is made excessively low. It is thus unsuitable to make the relative dielectric constant of the CF film 13 very low. However, in the case of the two-layer film, the adhesion between the lower film 51 and the BPSG layer 12 is high, and, in addition, the lower film 51 contains C as mentioned above, so that the adhesion between the CF film 13 and the lower film 51 is much higher than that between the CF film 13 and the BPSG layer 12. Therefore, even if the relative dielectric constant of the CF film 13 is made low, there is no possibility that separation occurs between the CF film 13 and the BPSG layer 12. For this reason, in the case of the two-layer film, the adhesion between the CF film 13 and a layer which is positioned under it is increased even if the relative dielectric constant of the CF film 13 is made low.

In the case of the two-layer film, the relative dielectric constant of the CF film 13 itself can be made lower as compared with a case where the CF film is in a single layer as mentioned above. Further, regarding the relative dielectric constant of the lower film 51, it is "4" when a—C film is used as the lower film 51, and "8" when SiC film is used as the same; these two values are greater than the relative dielectric constant of the CF film 13. However, these films have thicknesses of approximately 1/100 of the thickness of the CF film 13, and are thus much thinner than the CF film 13, so that the influence of these lower films 51 on the relative dielectric constant of the CF film 13 is almost negligible. It is thus possible to make the relative dielectric constant of the entire film low. Furthermore, this two-layer film can also be laminated in a plurality of rows. In this case, the adhesion to the CF film 13 on the upper row, especially to the Al wiring layer 14 in the CF film 13 is increased.

In the case of the above-described three-layer film, the adhesion between the three-layer film and a layer that is positioned under it, for example, the BPSG layer 12, is increased as in the case of the two-layer film, so that it is possible to make the relative dielectric constant of the entire film low. Moreover, since the upper film 52 is provided, the adhesion between the three-layer film and a layer that is positioned on top of it is increased. For example, in the case where a single layer of the CF 13 film is formed on top of the three-layer film like in an example shown in FIG. 11(b), if a single layer of the CF film 13 is used instead of the three-layer film, the adhesion between the Al wiring layer 14 and the CF film 13 becomes poor. Therefore, when the relative dielectric constant of the CF film 13 is made excessively low, separation occurs between the CF film 13 and the Al wiring layer 14.

On the other hand, in the case of the three-layer film, the adhesion between the upper film 52 and the Al wiring layer 14 is high; and, in addition, the adhesion between the upper film 52 and the CF film 13 is considerably high because the upper film 52 contains C as mentioned previously. Therefore, even if the relative dielectric constant of the CF film 13 is made low, there is no possibility that separation occurs between the CF film and the upper film 52. For this reason, in the case of the three-layer film, even if the relative dielectric constant of the CF film 13 is made low, the adhesion to a layer on the upper row, especially to Al wiring layer 14 is increased. Moreover, since the hardness of the upper film 52 is higher than that of the CF film 13, the three-layer film has improved thermal stability as in the above-described case where the capping film 4 is provided, and, at the same time, the effect in the CMP step, and the effect of protecting the surface of the CF film can also be obtained.

Subsequently, an experimental example which we carried out will be explained. A two-layer film was firstly formed by using a—C film or SiC film as the lower film 51, and the adhesion between the two-layer film and silicon substrate which is positioned under it was measured by the previously-mentioned Sebastian method by changing the thickness of the lower film 51. At this time, the film-forming conditions for the CF film, the a—C film and the SiC film were made as follows.

CF Film

Figure 5:
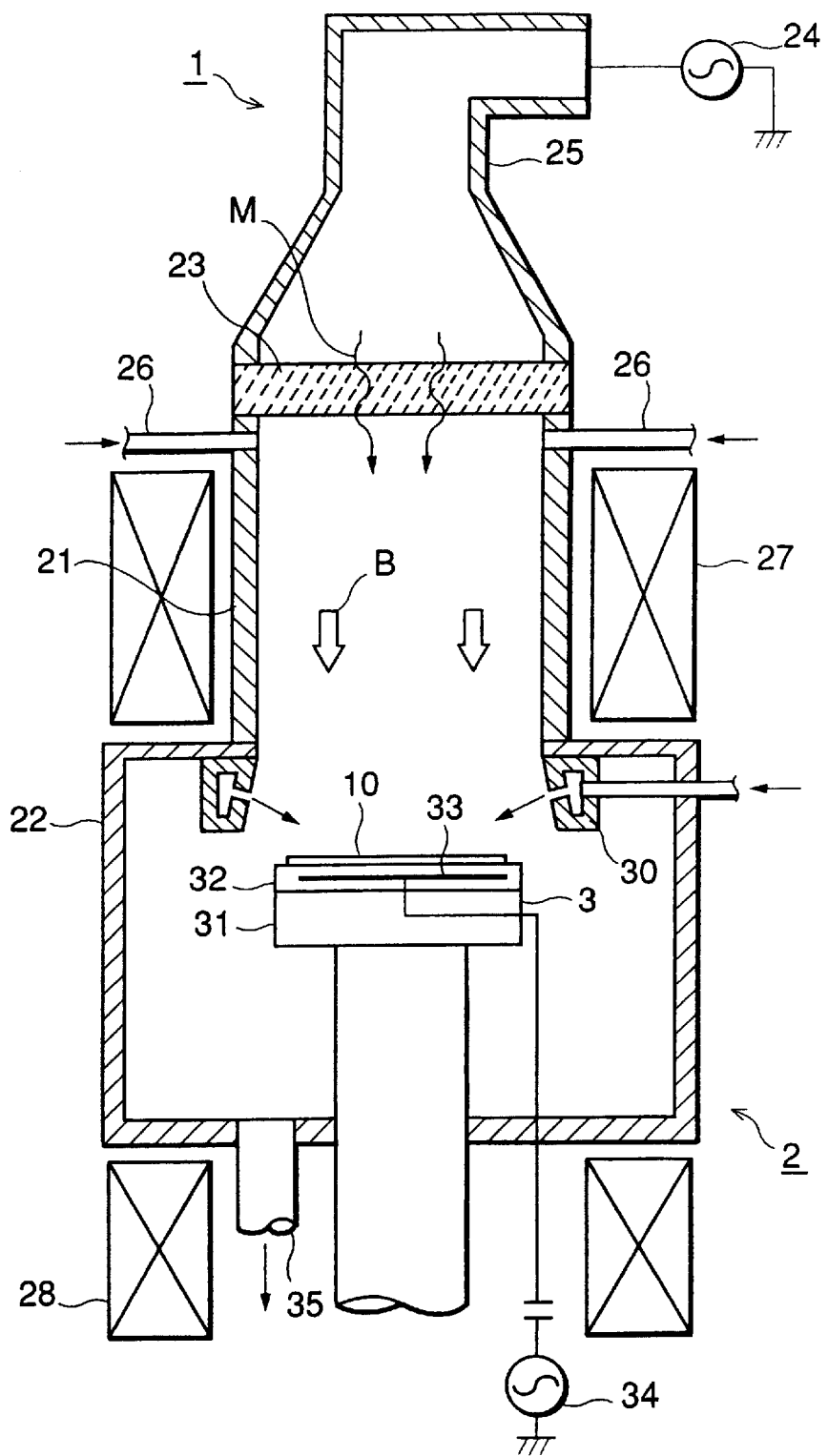
FIG. 5 is a sectional view of a plasma processing system that is used for producing a semiconductor device according to the embodiment of the present invention.

Film-forming processing was conducted by using the plasma processing system shown in FIG. 5, by introducing thereto, as film-forming gases, 60 sccm of $C_4F_8$ gas and 30 sccm of $C_2H_4$ gas, and, as a plasma gas, 150 sccm of Ar gas under the conditions of a film-forming pressure of 0.2 Pa, a microwave power of 2.7 kW, a radiofrequency power of 1.5 kW, and a wafer temperature of 350° C.

a—C Film

Film-forming processing was conducted by introducing, as film-forming gases, 100 sccm of $C_2H_4$ gas and 30 sccm of $H_2$ gas, and, as a plasma gas, 300 sccm of Ar gas. The other conditions were made the same as those for forming the CF film.

SiC Film

Film-forming processing was conducted by introducing, as film-forming gases, 40 sccm of $SiH_4$ gas and 30 sccm of $C_2H_4$ gas, and, as a plasma gas, 100 sccm of Ar gas. The other conditions were made the same as those for forming the CF film.

Figure 12:
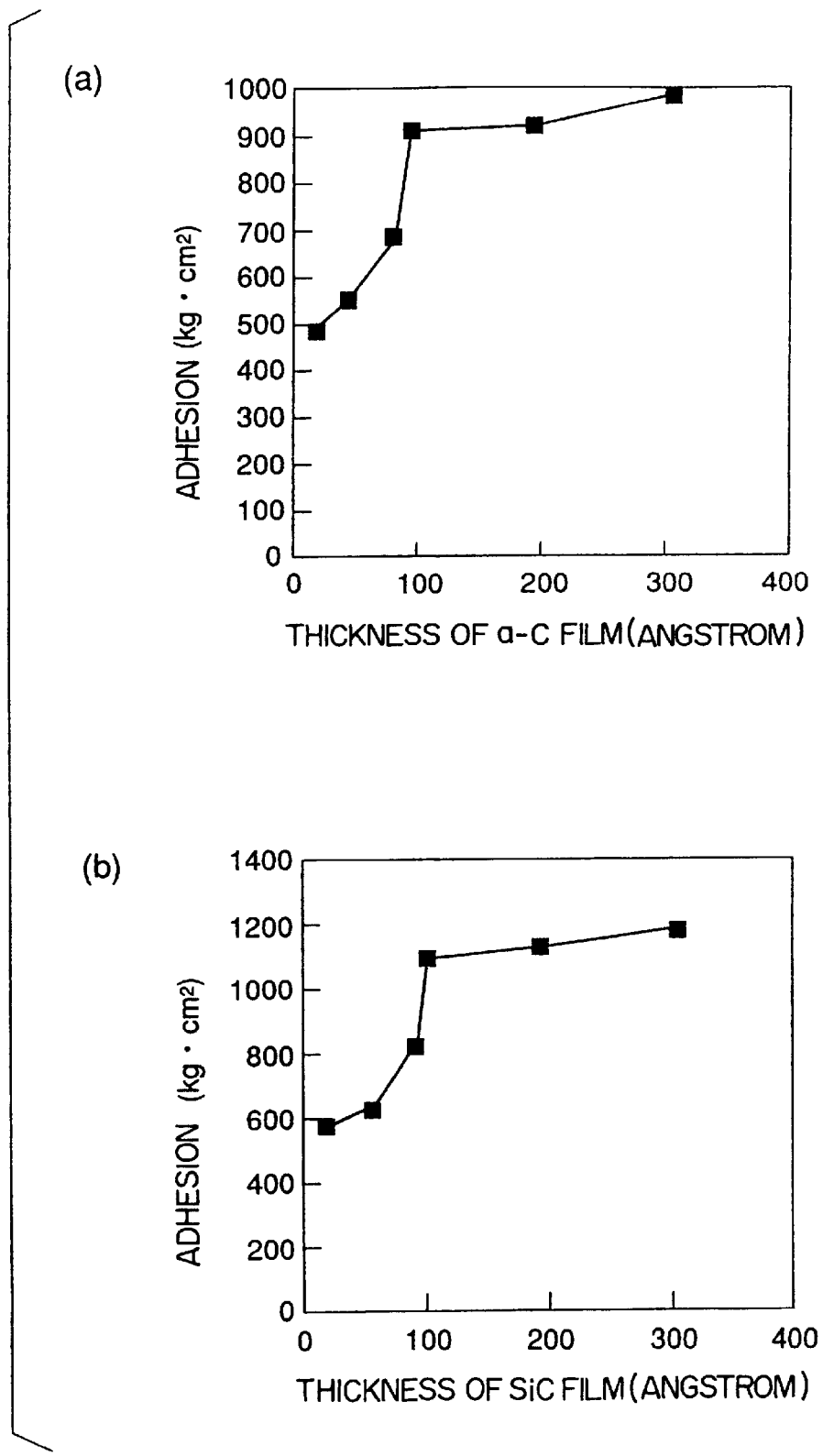
FIG. 12 is a characteristics diagram showing the relationship between the thickness and adhesion of a lower film.

The results of this experiment are shown in FIG. 12, in which FIG. 12(a) shows the results obtained in the case where the a—C film was used; and FIG. 12(b) shows the results obtained in the case where the SiC film was used. In this experiment, the thickness of the CF film was 10000 angstroms; the F content of the same was 22%; and the relative dielectric constant of the same was 2.4. From these results, it was found in either case, that when the thickness of the lower film 51 is made greater, the adhesion to the silicon substrate which is positioned under the two-layer film becomes higher; and it was confirmed that the adhesion becomes greater especially when SiC is used.

In the case where a—C film is used, when the thickness of this film is made 100 angstroms, the adhesion exceeds 900 kg/cm$^2$; and when the thickness is increased to more than 100 angstroms, the degree of increase in the adhesion becomes small. It is therefore desirable to make the thickness of the a—C film approximately 100 angstroms. Further, in the case where SiC film is used, when the thickness of this film is made 100 angstroms, the adhesion exceeds 1000 kg/cm$^2$; and when the thickness is increased to more than 100 angstroms, the degree of increase in the adhesion becomes small. Therefore, it is desirable to make the thickness of the SiC film approximately 100 angstroms.

Next, a two-layer film was formed by using a—C film, SiC film, or a gradient film as the lower film 51, and the adhesion between the two-layer film and silicon substrate which was positioned under it was measured by the previously-mentioned Sebastian method. Further, single-layer CF film was formed, and the adhesion to the silicon substrate was confirmed in the same manner. At this time, the conditions for forming the CF film, the a—C film and the SiC film were made as mentioned above. Further, in the case where the lower film 51 was a—C film or SiC film, the thickness of the lower film 51 was made 100 angstroms, and the thickness of the CF film 13 was made 10000 angstroms. In the case where the lower film 51 was the gradient film, the thickness of the lower film 51 was made 1000 angstroms, and the thickness of the CF film 13 was made 8000 angstroms. As the gradient film, a composite film consisting of a—C film and CF film (a—C composite), and a composite film consisting of SiC film and CF film (SiC film composite) were formed under the following conditions.

a—C Composite Gradient Film

Film-forming processing was conducted by introducing C$_4$F$_8$ gas, C$_2$H$_4$ gas and H$_2$ gas as film-forming gases, and Ar gas as a plasma gas by changing their flow rates linearly in terms of time from 0 sccm of C$_4$F$_8$ gas, 100 sccm of C$_2$H$_4$ gas, 30 sccm of H$_2$ gas, and 300 sccm of Ar gas to 60 sccm of C$_4$F$_8$ gas, 30 sccm of C$_2$H$_4$ gas, 0 sccm of H$_2$ gas, and 150 sccm of Ar gas. The other conditions were made the same as those for forming the CF film.

SiC Composite Gradient Film

Film-forming processing was conducted by introducing C$_4$F$_8$ gas, C$_2$H$_4$ gas, SiH$_4$ gas and H$_2$ gas as film-forming gases, and Ar gas as a plasma gas by changing their flow rates linearly in terms of time from 0 sccm of C$_4$F$_8$ gas, 100 sccm of C$_2$H$_4$ gas, 120 sccm of SiH$_4$ gas, 30 sccm of H$_2$ gas, and 300 sccm of Ar gas to 60 sccm of C$_4$F$_8$ gas, 30 sccm of C$_2$H$_4$ gas, 0 sccm of H$_2$ gas, and 150 sccm of Ar gas. The other conditions were made the same as those for forming the CF film.

The results are shown in FIG. 13. From these results, it was found that the adhesion between any one of the two-layer films and the silicon substrate which is positioned under it is almost twice greater than the adhesion between the single-layer CF film and the silicon substrate; and it was confirmed that the adhesion becomes great especially when SiC is used.

Subsequently, a three-layer film (a—C/CF/a—C) composed of 100 angstrom thick a—C film as the lower film 51, and 100 angstrom thick a—C film as the upper film 52; a three-layer film (SiC/CF/a—C) composed of 100 angstrom thick a—C film as the lower film 51, and 100 angstrom thick SiC film as the upper film 52; a three-layer film (a—C/CF/SiC) composed of 100 angstrom thick SiC film as the lower film 51, and 100 angstrom thick a—C film as the upper film 52; and a three-layer film (SiC/CF/SiC) composed of 100 angstrom thick SiC film as the lower film 51, and 100 angstrom thick SiC film as the upper film 52 were formed, and the adhesion between each of these three-layer films and Al layer which was provided on top of the three-layer film was measured. In all of these three-layer films, the F content of the CF film 13 was made 22%, and the thickness of the same was 10000 angstroms.

Figures 14, 15:
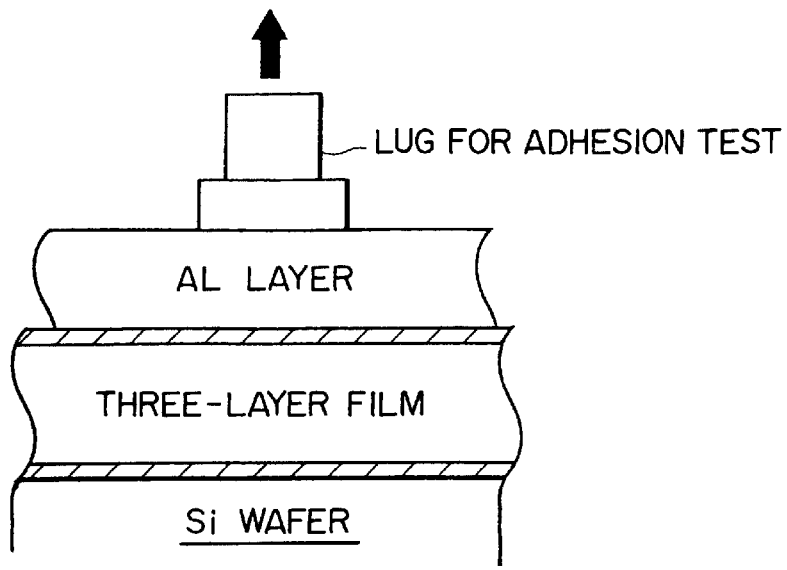
FIG. 14 is an explanatory view for explaining the Sebastian method.
FIG. 15 is a table showing the results of the measurement of the adhesion of three-layer films.

The adhesion was measured in the following manner: the three-layer film was formed on the surface of silicon wafer, and 8000 angstrom thick Al layer was formed on the surface of this three-layer film; a lug for adhesion test was fixed to the surface of this Al layer by using an adhesive; the lug was pulled up, and the pulling force per unit area of the lug (kg/cm$^2$) at the time when the Al layer was released from the three-layer film was taken as an index of adhesion. Regarding the single-layer CF film 13, and a two-layer film containing 100 angstrom thick a—C film as the lower film 51, the adhesion was measured in the same manner. Also in these cases, the F content of the CF film was made 22%, and the thickness of the same was made 10000 angstroms. The results are shown in FIG. 15.

From these results, it can be known that, in the case of the three-layer film, the adhesion to the Al layer provided on top of this film is considerably greater than the adhesion between the single-layer film or two-layer film and the Al layer provided thereon; and it was confirmed that the adhesion becomes great especially when SiC film is used as the upper film 52.

Further, the relative dielectric constants of the single-layer film, two-layer film, and three-layer film prepared in the above-described experimental examples were measured. As a result, the relative dielectric constant of the single-layer film was found to be 2.40; that of the two-layer film was found to be approximately 2.41; and that of the three-layer film was found to be approximately 2.43. It was thus confirmed that the relative dielectric constant is not so increased even if the CF film is made to have multilayered structure like a two-layer film or three-layer film.

In the above-described embodiments, when the interlayer dielectric film is formed in a plurality of rows, it is desirable that the interlayer dielectric on the lowest row be formed as a three-layer film, that a single-layer film be formed on the top surface of this three-layer film and that a two-layer film be formed on top of this single-layer film, as shown, for example, in FIG. 11(b). By doing so, it is possible to increase the adhesion by maintaining the relative dielectric constant of the interlayer dielectric film low.

Subsequently, still another embodiment of the present invention will be explained. The difference between this embodiment and the above-described embodiment is that, for example, the above-described three-layer film is formed by using a plasma processing system called cluster tool or the like, in which a plurality of vacuum processing chambers and cassette chambers are connected to a common carrier chamber.

Figure 16:
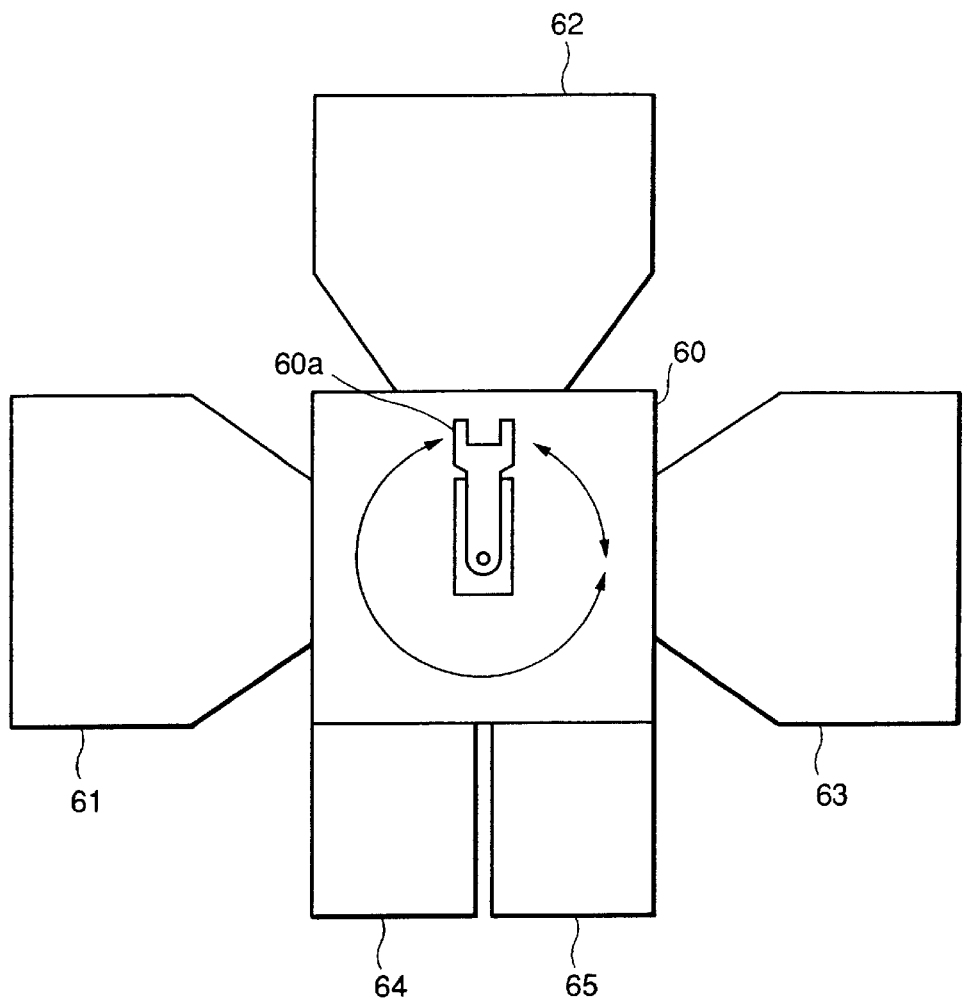
FIG. 16 is a perspective view showing a plasma processing system according to still another embodiment of the present invention.

The plasma processing system that is used in this embodiment is firstly explained by referring to FIG. 16. In the figure, numeral 60 shows a carrier chamber provided with a carrier arm 60a which constitutes a carrier member. To this carrier chamber 60, a first vacuum processing chamber 61, a second vacuum processing chamber 62, a third vacuum processing chamber 63, and two cassette chambers 64,65 are connected densely. These vacuum processing chambers 61 to 63 have the same structure as that of the previously-mentioned plasma processing chamber shown in FIG. 5. The cassette chambers 64,65 are preliminary vacuum chambers provided between the vacuum processing chambers and the atmospheric environment, and have gate doors, which are not shown in the figure, for opening and closing the atmospheric environment side.

Subsequently, the formation of a three-layer film containing a—C film as the lower film 51, and SiC film as the upper film 52 will be explained. In this system, the film-forming processing of the lower film 51 and that of the CF film 13 are conducted in parallel in the above-described first vacuum processing chamber 61 and second vacuum processing chamber 62, and the film-forming processing of the upper film 52 is conducted in the third vacuum processing chamber 63.

Specifically, for example, a 100 angstrom thick film is formed as the lower film 51 in the first vacuum processing chamber 61, by introducing thereto $C_2H_4$ gas and $H_2$ gas as first film-forming gases at flow rates of 100 sccm and 30 sccm, respectively, and Ar gas as a plasma gas at a flow rate of 300 sccm under the conditions of, for example, a pressure of 0.2 Pa, a microwave power of 2.7 kW, a radiofrequency power of 1.5 kW, and a wafer temperature of 350° C. Thereafter, a 10000 angstrom thick film is formed as the CF film 13 by introducing $C_4F_8$ gas and $C_2H_4$ gas as second film-forming gases at flow rates of 60 sccm and 30 sccm, respectively, and Ar gas as a plasma gas at a flow rate of 150 sccm.

After this, the wafer 10 on which the CF film 13 has been formed is carried by the carrier arm 60a from the first vacuum processing chamber 61 to the third vacuum processing chamber 63. In this chamber, a 300 angstrom thick film is formed as the upper film 52 by introducing $SiH_4$ gas and $C_2H_4$ gas as film-forming gases at flow rates of 40 sccm and 30 sccm, respectively, and Ar gas as a plasma gas at a flow rate of 150 sccm under the conditions of, for example, a pressure of 0.2 Pa, a microwave power of 2.7 kW, a radiofrequency power of 1.5 kW, and a wafer temperature of 350° C.

At this time, the film-forming processing of the lower film 51 and that of the CF film 13 are conducted in parallel in the first vacuum processing chamber 61 and in the second vacuum processing chamber 62, and the wafer 10 on which the CF film 13 has been formed is alternately carried to the third vacuum processing chamber 63 from the first vacuum processing chamber 61 and the second vacuum processing chamber 62.

In the case where a three-layer film is formed in the above-described manner, there can be obtained the following effect which cannot be obtained when a three-layer film is formed, for example, in one vacuum processing chamber by changing film-forming gases. Namely, in the case where a three-layer film is formed in one vacuum processing chamber, it is necessary that, after the lower film 51, CF film 13 and upper film 52 are formed on one wafer 10 by changing film-forming gases during the formation of these films, a three-layer film be formed on the next wafer 10.

While the wafer 10 is subjected to the film-forming processing, film is deposited also on the stage, and on the inside walls of the vacuum processing chambers. When the amount of the film deposited becomes larger, the film may form particles. In the case where a three-layer film is formed in one vacuum chamber, SiC film, the upper film 52, is also deposited on the wall of the vacuum processing chamber. This SiC film has a relative dielectric constant of as high as "8". Therefore, if the CF film 13 is contaminated with SiC particles while it is formed, the composition of the CF film 13 varies, and the relative dielectric constant of the CF film 13 may be increased. In contrast to this, in this embodiment, the upper film 52 is formed in the third vacuum processing chamber 63 separately from the CF film 13, so that there is no possibility that the CF film 13 is contaminated with SiC particles during the film-forming processing of the CF film 13.

Further, in this method, the film-forming processing of the lower film 51 and that of the CF film 13 are conducted in parallel in two vacuum processing chambers 61,62, and the film-forming processing of the upper film 52 is conducted in the third vacuum processing chamber 63. Therefore, the throughput of the film-forming processing of the three-layer film is improved. Namely, since the thickness of the CF film 13 is larger, the film-forming processing of the CF film 13 takes time as compared with the film-forming processing of the lower film 51 or of the upper film 52. However, since the film-forming processing of the CF film 13 is conducted in the two vacuum processing chambers 61,62, the throughput of the CF film 13 per unit time becomes twice. In addition, while the wafer 10 is carried from the vacuum processing chamber 61 to the third vacuum processing chamber 63, it is possible to conduct film-forming processing in the other vacuum processing chamber 62, so that the throughput is further increased.

The inventors of this application practically processed 25 pieces of wafer 10 by the use of the system shown in FIG. 16, by forming, on each wafer, 100 angstrom thick lower film 51 and 10000 angstrom thick CF film 13 in the first and third vacuum processing chambers 61,62 under the above-described conditions, and then 300 angstrom thick upper film 52 in the third vacuum processing chamber 63, and also another 25 pieces of wafer 10 by the conventional method, in which the lower film 51, CF film 13 and upper film 52 were formed on each wafer in one vacuum processing chamber; and measured the total processing time taken for each case in order to obtain the number of pieces of wafer 10 processed for one hour. As a result, the number of pieces of wafer 10 processed for one hour by the conventional method was 15, while the number of pieces of wafer 10 processed for one hour by the method of the present invention was 20. It was thus confirmed that the throughput can be improved by the method of the present invention.

This embodiment may also be applied to the production of the two-layer film. In this case, for example, the lower film 51 is formed in the first vacuum processing chamber 51, and the CF film 13 is then formed in the third vacuum processing chamber 52 and in the third vacuum processing chamber 53. By doing so, the CF film 13, the time taken for the formation thereof being long, can be formed in parallel in the two processing chambers, so that it is possible to increase the throughput.

Subsequently, still another embodiment of the present invention will be explained. In this embodiment, a preferable structure of a passivation film (protective film) provided on the outermost shell of a semiconductor chip will be explained. In general, when a semiconductor chip is formed, a two-layer protective film is formed by forming $Si_3N_4$ (silicon nitride) layer 72 on an wiring layer 71 on the topmost row by means of plasma CVD, and further coating polyimide 73 onto the top surface of this $Si_3N_4$ layer 72. And after this, packaging is conducted by molding a resin by means of, for example, injection molding, thereby obtaining a packaged chip.

Regarding the above-described protective film, the protective film is required to have moisture resistance in order to protect a semiconductor chip from moisture and the like, as well as the property of relaxing stress in order to relax stress caused during the above-described process of injection molding, thereby preventing the semiconductor chip in the package from undergoing stress. In general, a dense and hard film has moisture resistance, but is poor in the property of relaxing stress; on the other hand, a film that is good in the property of relaxing stress has low moisture resistance. Moisture resistance and the property of relaxing stress thus conflict with each other, so that it is impossible to obtain a film that is excellent in both moisture resistance and the property of relaxing stress. For this reason, the protective film has conventionally been formed by the combination use of $Si_3N_4$ film 72 having high moisture resistance and polyimide 73 that is excellent in the property of relaxing stress. As mentioned above, these films are formed in different manners, and cannot be simultaneously formed in one step, so that they have been formed in two steps.

This embodiment is to form such a protective layer by using a CF film. In this embodiment, a CF film 81 that has high moisture resistance is used as a layer corresponding to the conventional $Si_3N_4$ layer; and the CF film 82 that is excellent in the property of relaxing stress is used as a layer corresponding to the conventional polyimide layer. As the CF film 81 having high moisture resistance, for example, the CF film having an F content of 40 to 72% and a thickness of 5000 to 10000 angstroms can be used; and, as the CF film 82 that is excellent in the property of relaxing stress, for example, the CF film having an F content of 8 to 40% and a thickness of 5000 to 50000 angstroms can be used.

In the case where the protective layer is formed by using two layers of CF film in the above-described manner, the CF films 81, 82 can be formed by changing film-forming conditions. Therefore, they can be formed in one step by using, for example, the plasma processing system as shown in FIG. 5. In particular, the step of coating polyimide, the time conventionally taken to effect this step being long, is not needed in this embodiment, so that the processing time required for forming the protective layer can be remarkably shortened. Thus, not only the throughput is increased, but also the operation is simplified.

Figure 17:
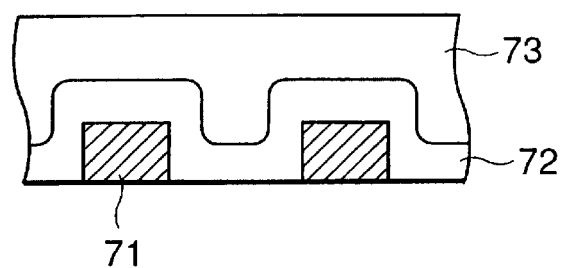
FIG. 17 is a sectional view of a conventional protective film.
Figure 18:
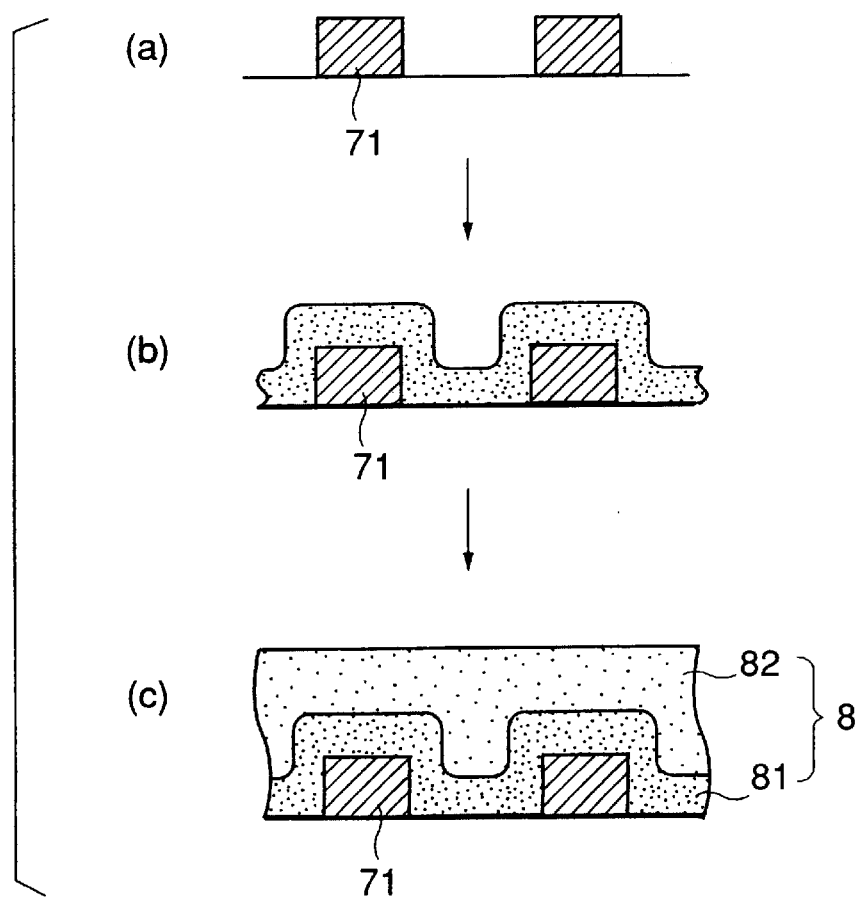
FIG. 18 is a sectional view of a protective film according to still another embodiment of the present invention.

An example for forming the above-described protective layer will now be explained. 5000 angstrom thick CF film 81 having high moisture resistance was formed on a chip provided with an wiring layer 71 (see FIG. 18(a)), as shown in FIG. 18(b) by the use of the plasma processing system shown in FIG. 5, by introducing thereto $C_4F_8$ gas and $C_2H_4$ gas as film-forming gases at flow rates of 60 sccm and 30 sccm, respectively, and Ar gas as a plasma gas at a flow rate of 150 sccm under the conditions of a pressure of 0.2 Pa, a microwave power of 2.7 kW, a radiofrequency power of 1.5 kW, an electric current of the primary magnetic coil of 200 A, and an electric current of the secondary magnetic coil of 160 A. Thereafter, the radiofrequency power was increased to 2 kW, and 50000 angstrom thick CF film 82 that was excellent in the property of relaxing stress was formed as shown in FIG. 17(c) by introducing $C_4F_8$ gas and $H_2$ gas as film-forming gases at flow rates of 60 sccm and 30 sccm, respectively, and Ar gas as a plasma gas at a flow rate of 150 sccm.

The total processing time required for forming the protective film on 25 pieces of wafer in the above-described manner was compared with that required for forming the protective film on 25 pieces of chip by the conventional method. As a result, it was found that the processing time required for this embodiment was 90 minutes shorter than the processing time required for the conventional method. It was thus confirmed that the throughput is increased.

Figure 19:
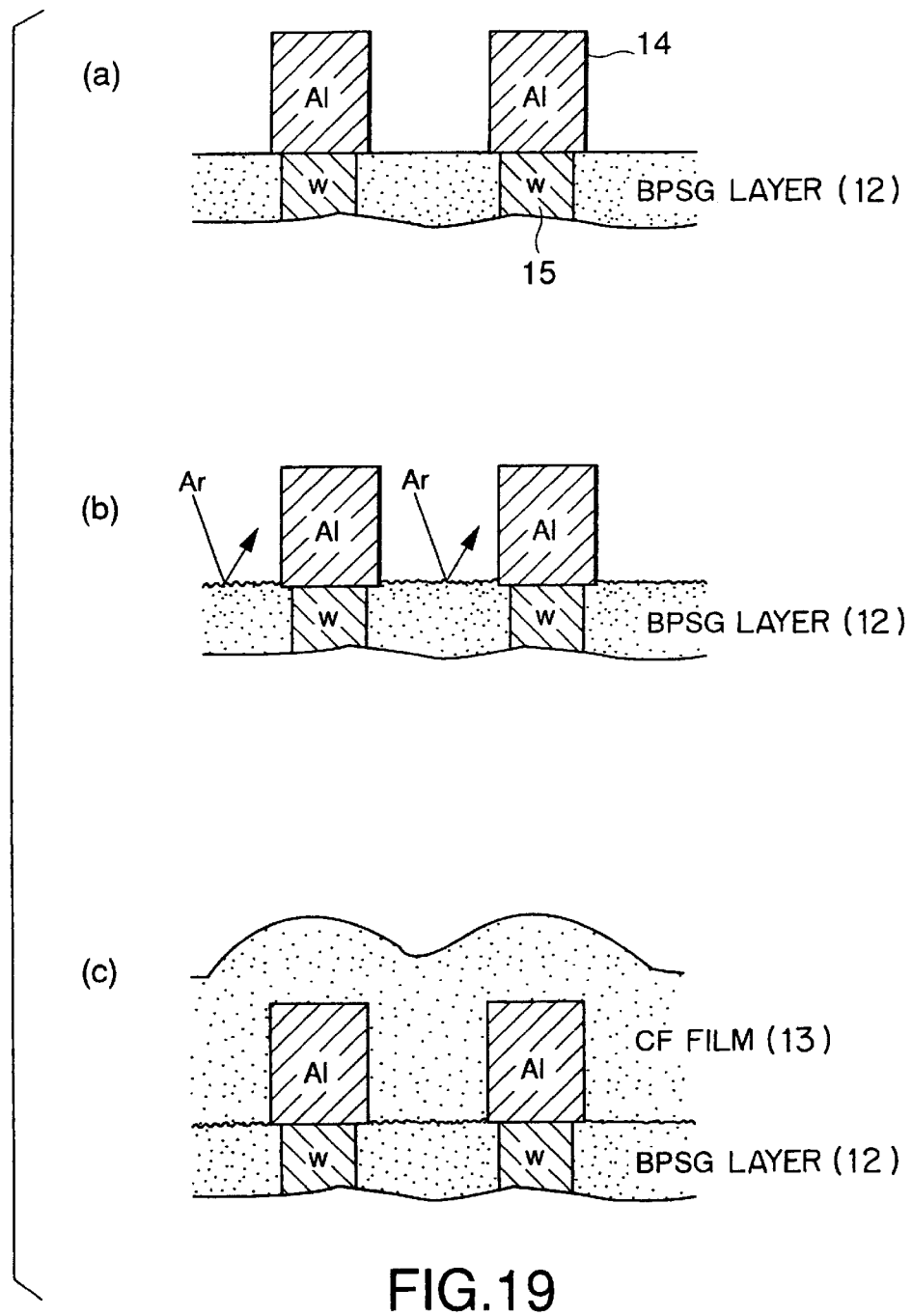
FIG. 19 is an explanatory view for explaining the action of still another embodiment of the present invention.

Subsequently, still another embodiment of the present invention will be explained. In this embodiment, a process which is effective, when CF film is used as the interlayer dielectric film, for increasing the adhesion between the CF film and a layer that is positioned under it. This method which is employed when CF film is formed on the BPSG layer 12 will be explained by referring to FIG. 19. FIG. 19(a) shows the state in which Al wiring layer 14 is formed on top of the BPSG layer 12.

In this process, a plasma of a pretreatment gas such as Ar gas or $O_2$ gas is applied to the surface of this BPSG layer 12 as shown in FIG. 19(b). Specifically, processing is conducted for, for example, 20 seconds by using the plasma processing system shown in FIG. 5, by introducing thereto Ar gas and $O_2$ gas from the plasma gas nozzles 26 at flow rates of 150 sccm and 200 sccm, respectively, and applying 250 W of bias voltage to the stage 3 under the conditions of, for example, a microwave power of 1500 W, a pressure of 0.2 Pa, an electric current of the primary magnetic coil 27 of 200 A, an electric current of the secondary magnetic coil 28 of 200 A, and a surface temperature of the stage of 200° C.

Thereafter, the CF film 13 is formed on the surface of the BPSG layer 12 as shown in FIG. 19(c) by introducing Ar gas as a plasma gas from the plasma gas nozzles 26 at a flow rate of 150 sccm, and, for example, $C_4F_8$ gas and $C_2H_4$ gas as film-forming gases from the film-forming gas feed section 30 at flow rates of 60 sccm and 30 sccm, respectively, and applying 1500 W of bias voltage to the stage 3 under the conditions of, for example, a microwave power of 2700 W, a pressure of 0.2 Pa, an electric current of the primary magnetic coil 27 of 200 A, an electric current of the secondary magnetic coil 28 of 200 A, and a surface temperature of the stage of 200° C.

When the CF film 13 is formed after the plasma of Ar or the like is applied to the BPSG layer 12, there can be obtained such an effect that the adhesion between the BPSG layer 12 and the CF film 13 is increased. As the plasma of a pretreatment gas that is applied to the BPSG layer 12, a plasma of a rare gas such as Ar gas or Ne gas, $O_2$ gas, $N_2$ gas, a gas for creating hydrogen plasma such as $H_2$ gas or $H_2O$ gas, or $N_2O$ gas can be used.

The reason why the above-described effect can be obtained will now be explained. When the above-described plasma of Ar or the like is applied to the surface of the BPSG layer 12, this surface is beaten by the plasma, and irregularities of several angstroms to several tens angstroms are formed on this surface. When such irregularities are formed on the surface, the surface area of the BPSG layer 12 is increased, so that the contact area between the BPSG layer 12 and the CF film 13 becomes large as compared with the case where the BPSG layer 12 has no such irregularities. It is thus considered that the physical adhesion is increased.

Further, in the case where CF film 13 has been formed on the lower row, when a plasma of $H_2$ or $H_2O$ is applied, F that is present on the surface of the CF film 13 on the lower row reacts with the plasma of $H_2$ or $H_2O$, and is taken away as HF, so that the surface of the CF film 13 is activated. Therefore, in the film-forming processing of the CF film 13, the CF film is formed on this activated surface, so that the chemical adhesion is considered to become great as compared with the case where CF film is formed on a non-activated surface. In this case, it is presumed that the adhesion is increased by the synergistical action of the above-described physical adhesion and this chemical adhesion.

Next, an example that was carried out in order to confirm the effect of this embodiment will be explained. In the plasma processing system shown in FIG. 5, a plasma was applied to bare silicon under the above-described conditions, and the CF film 13 was then formed on the surface of this bare silicon under the above-described conditions. At this time, the application of the plasma and the formation of the CF film were conducted by changing the time for processing to be conducted by the application of the plasma, and the adhesion was confirmed by a tape test. Further, the same experiment was carried out also in terms of the case where the bare silicon was replaced with Th—$SiO_2$ (thermally oxidized silicon film). The results are shown in FIG. 20.

In FIG. 20, the results of the tape test are shown by "◯" when peeling of film was not caused, and by "X" when peeling of film was caused. From the results, it is confirmed that, as long as the time for processing conducted by the application of the plasma is 10 seconds or longer, peeling of film is not caused both in the case where the substrate is bare silicon and in the case where the substrate is Th—$SiO_2$. It was thus found that the adhesion is increased by the application of a plasma.

Subsequently, in the above example, the adhesion of the CF film was confirmed by changing the radiofrequency power. At this time, the other conditions were made the same as the above-described conditions, and the time for processing to be conducted by the application of the plasma was made 10 seconds. The results are shown in FIG. 21. From the results, it is confirmed that, as long as the radiofrequency power is 250 W or more, no peeling of film is caused both in the case where the substrate is bare silicon and in the case where the substrate is Th—$SiO_2$. It was thus found that the adhesion is increased by the application of a plasma.

Next, in the above example, the adhesion of the CF film was confirmed by changing the flow rate of Ar gas. At this time, the other conditions were made the same as the above-described conditions, and the time for processing to be conducted by the application of the plasma was made 30 seconds. The results are shown in FIG. 22. From the results, it is confirmed that, as long as the flow rate of Ar gas is 150 sccm or more, no peeling of film is caused both in the case where the substrate is bare silicon and in the case where the substrate is Th—$SiO_2$. It was thus found that the adhesion is increased by the application of a plasma.

Thus, in this embodiment, it is possible to increase the adhesion between the CF film and a layer which is positioned under it because a plasma is applied to the layer on the lower row before the CF film is formed thereon. In this embodiment, as the layer on the lower row, not only the above-described BPSG layer but also CF film, bare silicon, Th—$SiO_2$ or the like can be used.

Subsequently, a process suitable for the case where an adhesive layer of TiN (titanium nitride) is formed on the aluminum wiring layer in a semiconductor device of the present invention. It is known that aluminum hardly corrodes when only F is present but that the corrosion of aluminum proceeds when Cl (chlorine) is also present (Toshiba Technology Publication: Vol. 13, No. 50.195–196.1995). In the etching step that is effected for forming the Al wiring layer 14, chlorine gas is used, and the Cl remains on the surface of the Al wiring layer 14 although its amount is extremely small. Therefore, when CF film is formed on this surface, the Al wiring layer 14 corrodes by interaction between the remaining Cl and F that is contained in the CF film.

Figure 23:
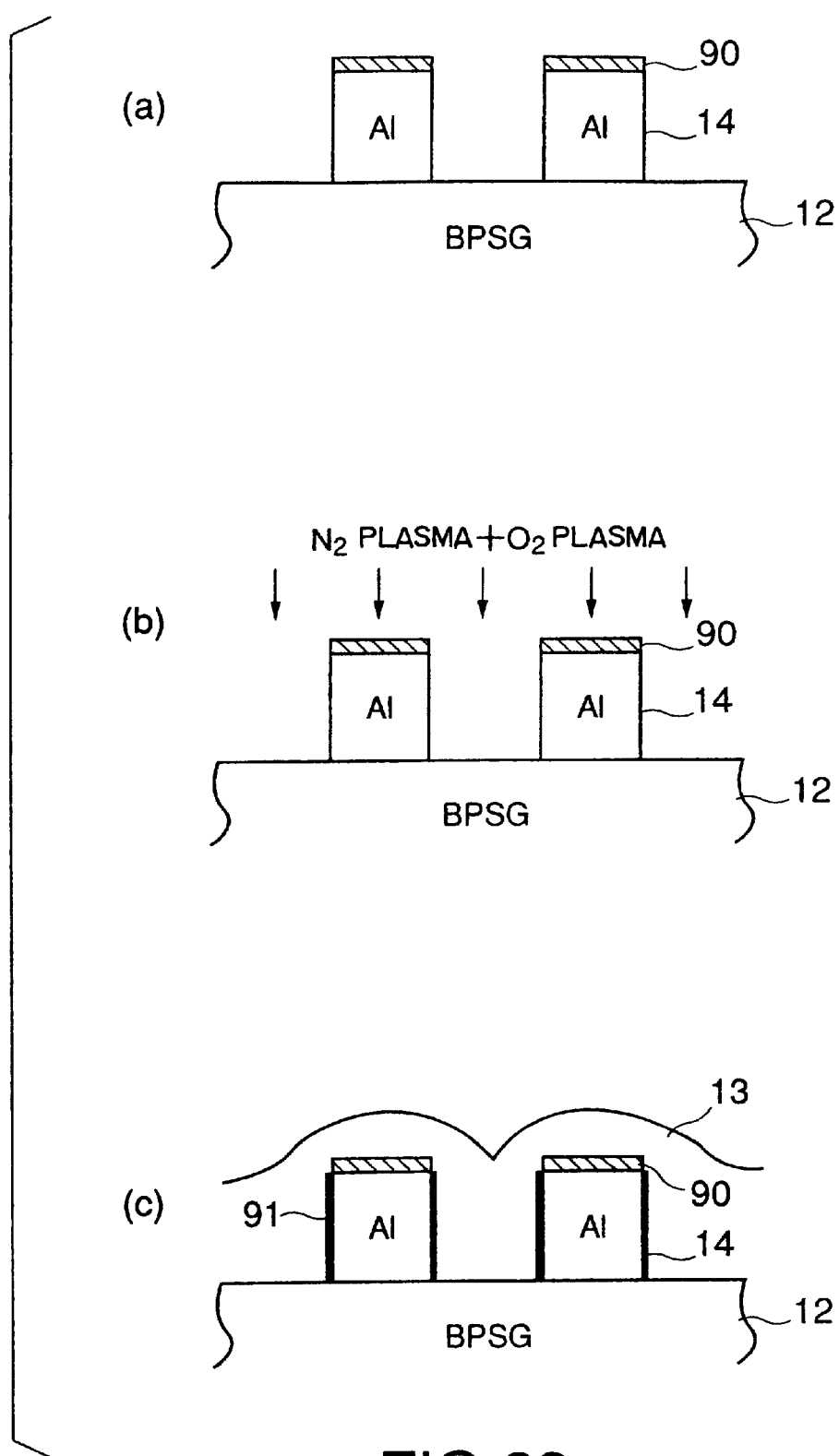
FIG. 23 is an explanatory view for explaining the action of still another embodiment of the present invention.

For this reason, $N_2$ plasma (nitrogen plasma) and $O_2$ plasma (oxygen plasma) are applied to the surface of the Al wiring layer 14 in this embodiment. On top of the Al wiring layer 14, a conductive layer made of, for example, tungsten, embedded in the previously-mentioned via hole 16 will be formed as shown in FIG. 1. In order to obtain good adhesion between tungsten and aluminum, thin TiN layer 90 having a thickness of, for example, approximately 200 angstroms is generally formed on the surface of the Al wiring layer 14 as shown in FIG. 23(a). By applying $N_2$ plasma to this Al wiring layer 14, AlN (aluminum nitride) 91 is formed on the sidewall of the Al wiring layer 14. Since AlN has extremely high corrosion resistance, it can prevent the corrosion of the Al wiring layer 14.

Further, the TiN layer 90 is stabilized when $N_2$ plasma is applied thereto. In the case where TiN is formed by means of a reactive sputtering method, Ti—Ti bond inevitably remains because, in this method, $N_2$ plasma and Ar plasma are allowed to collide with a target made of Ti. Therefore, this bond is broken by $N_2$ plasma, and Ti—N bond is thus formed. In the case where TiN is formed by a plasma CVD method, Ti—Cl bond remains because, for example, $TiCl_4$ gas and $NH_3$ gas are allowed to react with each other. This bond is broken by the application of $N_2$ plasma, and Ti—N bond is thus formed.

Furthermore, the effects obtainable by the application of $O_2$ plasma are as follows. Since the TiN layer 90 is in the state of columnar crystals, there is such a possibility that atoms pass through between the crystals. The TiN layer 90 is simultaneously formed on the Al wiring layer 14 by means of etching when the Al wiring layer 14 is etched, so that it is larger than the via hole 16. Therefore, the TiN layer 90 is in contact with the CF film 13. For this reason, there is a possibility that F contained in the CF film 13 passes through the TiN layer 90 to reach the surface of the Al wiring layer 14, thereby corroding the Al wiring layer 14.

When $O_2$ plasma is applied, O enters between the columnar crystals, and forms TiON together with N, thereby preventing F from passing through the crystals. Therefore, this method is very effective for a device structure in which CF film is used as, for example, the interlayer dielectric film, and Al wiring layer 14 is used.

The step of applying $O_2$ plasma and $N_2$ plasma can be effected by the use of, for example, the previously-mentioned ECR system, by feeding thereto $O_2$ gas and $N_2$ gas at flow rates of 100 sccm and 100 sccm, respectively, under the conditions of a pressure of 0.2 Pa, a microwave power of 2000 W, and a bias electric power of 500 W. It is noted that N—O gas such as $N_2O$ gas may also be used as the gas for processing.

According to the present invention, it is possible to make the relative dielectric constants of dielectric films to be used in semiconductor devices low.

What is claimed is:

1. A method for producing a semiconductor device, comprising the steps of:

forming a first dielectric film comprising of fluorocarbon film on the surface of the base dielectric film to which the plasma has been applied.

2. The method for producing a semiconductor device according to claim 1, wherein:

the plasma of the pretreatment gas comprises one of Ar, Ne, $O_2$, $H_2$, $H_2O$, $N_2O$, $N_2$.

3. The method for producing a semiconductor device according to claim 1, further comprising:

the step of forming a second dielectric film harder than the first dielectric film, on a surface of the first dielectric film.

4. The method for producing a semiconductor device according to claim 3, further comprising:

the step of abrading the second dielectric film by using a CMP.

5. The method for producing a semiconductor device according to claim 3, wherein:

the second dielectric film comprises one of an SiOF film, an SiBN film, an SiC film, a BN film and a hydrogenated amorphous carbon film.

6. A method for producing a semiconductor device, comprising the steps of:

preparing a substrate having a base dielectric film;

forming a first dielectric film on a surface of the base dielectric film;

the first dielectric film comprising one of an SiC film, a hydrogenated amorphous carbon film, and a film consisting of a lower part of hydrogenated amorphous carbon and an upper part in which the fluorine content becomes higher toward an upper end; and forming a second dielectric film comprising a fluorocarbon film on a surface of the first dielectric film.

7. The method for producing a semiconductor device according to claim 6, further comprising:

the step of forming a third dielectric film on a surface of the second dielectric film;

the third dielectric film comprising one of an SiC film, a hydrogenated amorphous carbon film, and a film consisting of a lower part of hydrogenated amorphous carbon and an upper part in which the fluorine content becomes higher toward an upper end.

8. The method for producing a semiconductor device according to claim 7, wherein the step of forming the third dielectric film comprises the steps of:

creating a plasma from a pretreatment gas comprising $H_2$ or $H_2O$, and applying the plasma of the pretreatment gas to the surface of the second dielectric film; and forming the third dielectric film comprising a fluorocarbon film on the surface of the second dielectric film.

* * * * *